(12) United States Patent
Otake et al.

(10) Patent No.: US 7,255,981 B2
(45) Date of Patent: *Aug. 14, 2007

(54) MASK, SUBSTRATE WITH LIGHT REFLECTIVE FILM, METHOD FOR MANUFACTURING LIGHT REFLECTIVE FILM, LIQUID CRYSTAL DISPLAY DEVICE, AND ELECTRONIC APPARATUS

(75) Inventors: Toshihiro Otake, Okaya (JP); Mutsumi Matsuo, Misato-mura (JP); Tadashi Tsuyuki, Okaya (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/368,196

(22) Filed: Mar. 3, 2006

(65) Prior Publication Data

US 2006/0147844 A1    Jul. 6, 2006

Related U.S. Application Data

(62) Division of application No. 10/410,518, filed on Apr. 9, 2003, now Pat. No. 7,060,396.

(30) Foreign Application Priority Data

Apr. 10, 2002    (JP)    ............................ 2002-108529

(51) Int. Cl.
    G02F 1/1335    (2006.01)

(52) U.S. Cl. .................... 430/321; 349/113; 349/114
(58) Field of Classification Search .................... None
    See application file for complete search history.

(56) References Cited

U.S. PATENT DOCUMENTS

| 5,408,345 A | 4/1995 | Mitsui et al. |
| 5,500,750 A * | 3/1996 | Kanbe et al. .................. 349/42 |
| 6,384,886 B2 | 5/2002 | Yamazaki et al. |
| 6,985,196 B2 * | 1/2006 | Otake et al. ................. 349/113 |
| 2001/0010571 A1 | 8/2001 | Kanou et al. |

FOREIGN PATENT DOCUMENTS

| JP | 11-337964 | 12/1999 |
| JP | 2000-2875 | 1/2000 |
| JP | 2000-221494 | 8/2000 |
| JP | 2001-083538 | 3/2001 |
| JP | 2001-201742 | 7/2001 |

* cited by examiner

*Primary Examiner*—John A. McPherson
(74) *Attorney, Agent, or Firm*—Harness, Dickey & Pierce, P.L.C.

(57) ABSTRACT

A substrate is provided with a light reflective film including a base and a reflective layer, in which a plurality of concave portions or convex portions formed on the surface of the base are randomly arranged in the plane direction in 100 to 2,000 RGB dot units or a whole screen unit, are formed using a mask in which light transmissive or non-transmissive portions are randomly arranged in the plane direction in 100 to 2,000 RGB dot units or the whole screen unit.

20 Claims, 18 Drawing Sheets

FIG. 7
(a)
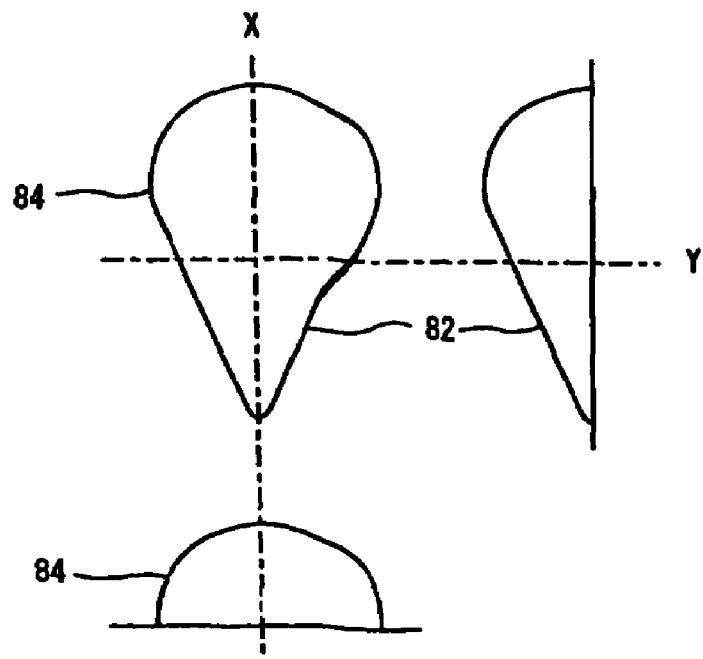
(b)
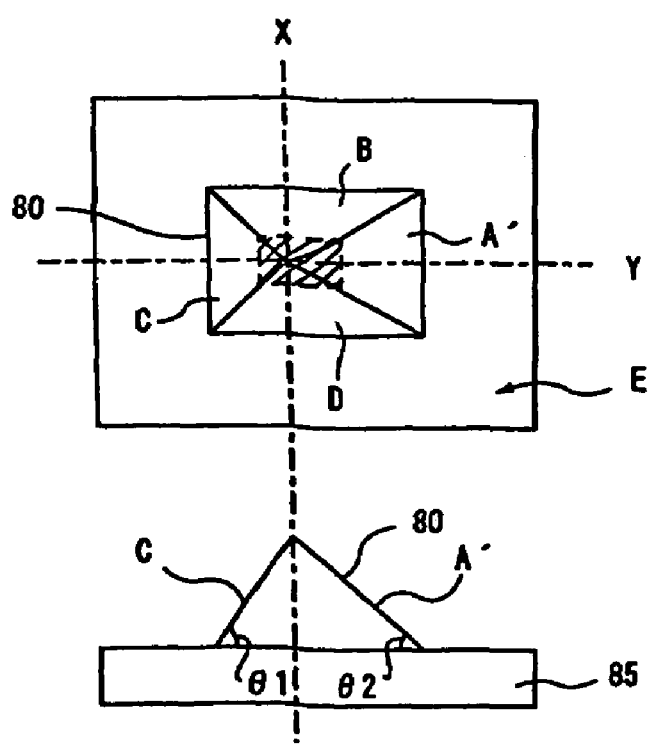

FIG. 11

FORMATION PROCESS OF A LIGHT REFLECTING FILM

FORMATION OF A FIRST LAYER:
- P31 APPLYING A FIRST LAYER — 800 RPM × 10 SEC.
- P32 PRE-BAKING — HOT PLATE/100° C, 2 MIN.
- P33 EXPOSING i-RAY — 365 nm/Gp = 60 μm, EXPOSING TOTALLY FOR 4SEC WITH 80 mJ
- P34 DEVELOPING — POSITIVE DEVELOPMENT
- P35 POST-EXPOSING — i-RAY OVERALL RADIATION/300 mJ
- P36 POST-BAKING — 220° C, 50 MIN.

FORMATION OF A SECOND LAYER:
- P37 APPLYING A SECOND LAYER — 1000 RPM × 10 SEC.
- P38 PRE-BAKING — HOT PLATE/100° C, 2 MIN.
- P39 EXPOSING i-RAY — 365 nm/Gp = 120 μm, EXPOSING TOTALLY FOR 5 SEC WITH 100 i
- P40 EXPOSING i-RAY — POSITIVE DEVELOPMENT
- P41 POST-EXPOSING — i-RAY OVERALL RADIATION/300 mJ
- P42 POST-BAKING — 220° C, 50 MIN.

FORMATION OF A REFLECTING FILM:
- P43 APPLYING REFLECTING FILM MATERIAL — 0.2 μm
- P44 PHOTO-ETCHING THE REFLECTING FILM — FOR TRANSMISSIED LIGHT REMOVING THE PERIPHERY

FIG. 27
PRIOR ART
(a)
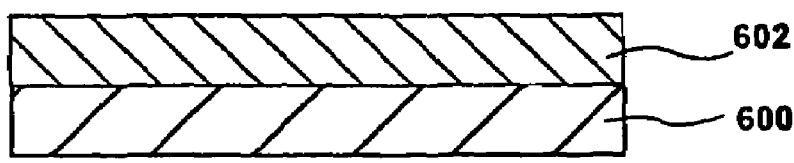
(b)
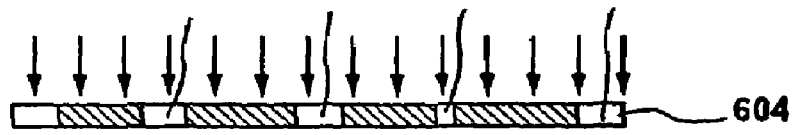
(c)
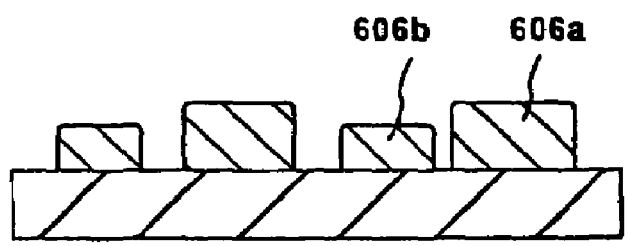
(d)
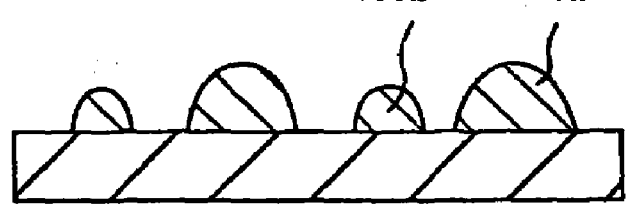
(e)
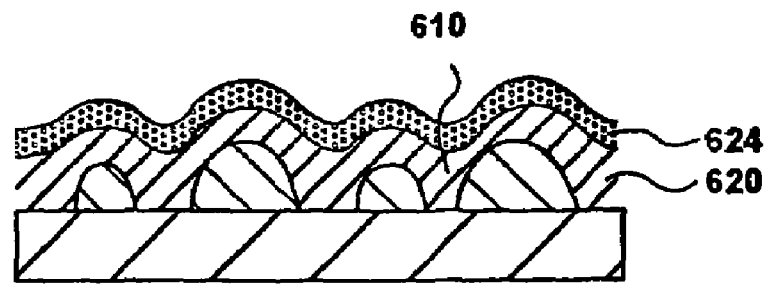

MASK, SUBSTRATE WITH LIGHT REFLECTIVE FILM, METHOD FOR MANUFACTURING LIGHT REFLECTIVE FILM, LIQUID CRYSTAL DISPLAY DEVICE, AND ELECTRONIC APPARATUS

CROSS REFERENCE TO RELATED APPLICATIONS

This application is a divisional patent application of U.S. Ser. No. 10/410,518 filed Apr. 9, 2003 now U.S. Pat. No. 7,060,396, claiming priority to Japanese Application No. 2002-108529 filed Apr. 10, 2002, all of which are hereby incorporated by reference.

BACKGROUND

1. Technical Field of the Invention

The present invention relates to a mask, a substrate with a light reflective film, a method for manufacturing a light reflective film, an optical display device, and an electronic apparatus, and more specifically, it relates to a mask for manufacturing a substrate with a light reflective film generating few interference fringes, a substrate with a light reflective film formed by using the mask, a method for manufacturing a light reflective film, an optical display device having a light reflective film on which hardly any interference fringes are generated, and an electronic apparatus having a light reflective film on which hardly any interference fringes are generated.

2. Related Art

As widely known, liquid crystal display devices are widely used as display devices in various electronic apparatuses because of their ability to reduce thickness and power consumption. Such liquid crystal display devices normally have a configuration in which a liquid crystal is injected between a pair of glass substrates and the peripheral edges of the substrates are sealed by a sealant. An electronic apparatus having such a liquid crystal display device therein adopts a configuration in which a protective plate is provided on the viewing side of the liquid crystal display device, that is, the side a viewer observes the display thereon, in order to protect the liquid crystal display device against external impacts. The protective plate is a plate-shaped member which is normally made of a material having light transmittance characteristics, for example, transparent plastic, etc.

However, in such protective plate, it is difficult to make its surface facing the liquid crystal display device completely smooth, and fine concave portions or convex portions exist on the surface in many cases. Therefore, in the case of providing such a protective plate on the liquid crystal display device, there is a problem that the display quality is greatly deteriorated due to the fine concave portions or convex portions on the surface.

One reason for the deterioration of the display quality is that the gap between the substrate at the viewing side and the protective plate in the liquid crystal display device is uneven due to the concavities or convexities existing on the surface of the protective plate. That is, corresponding to the unevenness of the gap, interference occurs when light coming from the liquid crystal display device passes through the protective plate and as a result, interference fringes are generated. It is presumed that the display quality is deteriorated because the generated interference fringes and the display images are mixed.

A reflective liquid crystal display device 400 as shown in FIG. 25 is disclosed in Japanese Unexamined Patent Application Publication No. 6-27481; a transflective type liquid crystal display device 500 as shown in FIG. 26 is disclosed in Japanese Unexamined Patent Application Publication No. 11-281972. In the respective devices, a plurality of concave or convex structures 404a, 404b (504a, 504b) having different heights from each other are provided to decrease the occurrence of interference fringes, and a high-molecular resin film 405 (505) is formed thereon, and a continuous wave-shaped reflective electrode 409 (509) is formed thereon.

In addition, a manufacturing process of a liquid crystal display device having such a reflective electrode is illustrated on FIG. 27, for example. First, as shown in FIG. 27(a), a photoresist film 602 is formed on the overall surface of a glass substrate 600, and then, as shown in FIG. 27(b), the photoresist film 602 is exposed through a pattern 604 comprising a plurality of circles of different diameters. Then, as shown in FIG. 27(c), it is developed, and a plurality of concave or convex portions 606a, 606b, each having different height and angle, are provided. Then, by heating the concave or convex portions and softening the angled portion of the concave or convex portions as shown in FIG. 27(d), angle-removed concave or convex portions 608a, 608b are formed. As shown in FIG. 27(e), the space 610 between the concave or convex structures is filled with a predetermined amount of high-molecular resin 620 to make a continuous layer having the wave-shaped surface. In addition, a wave-shaped reflective electrode 624 is formed on the high-molecular resin film 620 by using a stacking method such as a sputtering method.

The reflective liquid crystal display device or transflective liquid crystal display disclosed in Japanese Unexamined Patent Application Publication No. 6-27481, employs a mask pattern on which a plurality of circles of different diameters, are aligned uniformly or non-uniformly in part, to provide a structure having a plurality of concavities or convexities of different heights by using ultraviolet exposure and development. However, it is difficult to adjust the height precisely to effectively prevent the light interference because of the unevenness of the coating thickness, or the like. In addition, since a reflective electrode is formed on the structure having the plurality of concaves or convexes of different heights, there often occurs a breaking of wire or short circuit, too. In addition, the disclosed method for manufacturing a light reflective film involves many processing steps and management items to be processed, which results in many problems in the manufacture.

Therefore, according to the light reflective film disclosed in Japanese Unexamined Patent Application Publication No. 6-27481, it is not only difficult to prevent the occurrence of interference fringes effectively, but also difficult to manufacture such light reflective film stably and effectively.

Thus, there have been proposed methods for manufacturing the above-described reflective-type liquid crystal display device or the above-described transflective type liquid crystal display device using a mask in which light transmissive or non-transmissive portions are randomly arranged. Although the above-proposed methods reduce the occurrence of the interference fringe, a new problem has been found that stains of various shapes are seen on a screen, thereby causing remarkable deterioration of display quality.

The present inventors have extensively studied the above described problems and found that a light reflective film which generates few interference fringes while suppressing the occurrence of various-shaped stains when incorporated into a liquid crystal display device can be achieved by providing a plurality of concave portions or convex portions on a base at random and in a specific arrangement.

Therefore, it is an object of the present invention to provide a mask used for manufacturing a substrate with a light reflective film with reduced occurrence of the interference fringe, a substrate with a light reflective film obtained using the mask, a method for manufacturing the light reflective film, a liquid crystal display provided with the light reflective film, and an electronic apparatus comprising the light reflective film.

SUMMARY

In accordance with one aspect of the present invention, the above and other objects can be accomplished by the provision of a mask for manufacturing a substrate with a light reflective film, wherein light transmissive or non-transmissive portions are randomly arranged in the plane direction in 100 to 2,000 RGB dot units or a whole screen unit.

That is, since the light transmissive or non-transmissive portions are randomly arranged, the substrate provided with the light reflective film exhibits excellent light scattering effect and effectively prevents the occurrence of the interference fringe.

On the other hand, the occurrence of stains of various shapes due to such random arrangement of the light transmissive or non-transmissive portions can be remarkably reduced by arranging them in units of more than a predetermined number of RGB dots of the liquid crystal display device using the substrate with the light reflective film.

The reason why the plane arrangement of the light transmissive or non-transmissive portions is controlled is that there are two types of photosensitive resins to be used for making the base of the light reflective film; one is a positive type which is photolyzed and becomes soluble in a developing agent at its area on which light having passed the light transmissive portions is radiated; and the other is a negative type, and its area radiated by the light having passed the light transmissive portions is exposed and becomes insoluble in the developing agent.

In making the mask of the present invention, preferably, a random pattern of light transmissive or non-transmissive portions for 3 to 12 RGB dots and randomly arranged as it is or after being divided, thereby to form the light transmissive or non-transmissive portions in 100 to 2,000 dot units or a whole screen unit.

Thereby, even with relatively little information regarding the patterns of the light transmissive portions or the light non-transmissive portions, the mask having a large area can be easily formed in a short time.

In making the mask of the present invention, preferably, a stripe-shaped random pattern of light transmissive or non-transmissive portions in a row direction or in a column direction is formed and is repeated in a plurality of lines, to thereby form the light transmissive or non-transmissive portions.

Thereby, even with little information, it is possible to easily form the random pattern with desirable reflectivity as a whole in a short time. Further, it is possible to obtain the random patterns of desirable reflectivity as a whole with good reproducibility by repeating predetermined units of random patterns in horizontal or vertical direction.

In making the mask of the present invention, preferably, the diameters of the light transmissive or non-transmissive portions are any value within the range of 3 to 15 μm.

Thereby, it is possible to effectively manufacture a substrate with a light reflective film to reduce the occurrence of an interference fringe. This is because when the substrate with the light reflective film is manufactured, in case that the light transmissive or non-transmissive portions have such diameters, it is possible to precisely control the planar shapes and the arrangement patterns of the portions using an exposure process. As a result, it is possible to reliably scatter light in the substrate with the light reflective film, thereby effectively preventing the occurrence of an interference fringe.

In making the mask of the present invention, preferably, the light transmissive or non-transmissive portions have different diameters to form a plurality of kinds of light transmissive or non-transmissive portions.

Thereby, it is possible to effectively manufacture a substrate with the light reflective film to reduce the occurrence of the interference fringe. That is, when the substrate with the light reflective film including a plurality of concave portions or convex portions is manufactured, the concave portions or convex portions can be arranged more diversely due to the existence of the plurality of concave portions or convex portions of different diameters. Accordingly, it is possible to properly scatter light in the obtained substrate with the light reflective film, thereby effectively preventing the occurrence of an interference fringe.

In case that the light transmissive or non-transmissive portions have different diameters, preferably, the diameter of at least one of the portions is 5 μm or more. In case that every portion has a diameter of below 5 μm and has a circle or polygonal shape, when the substrate with the light reflective film is manufactured, light is often excessively scattered, and the amount of reflected light in the substrate with the light reflective film may be remarkably reduced.

In accordance with a further aspect of the present invention, there is provided a substrate with a light reflective film including a base and a reflective layer, wherein a plurality of concave portions or convex portions formed on the surface of the base are randomly arranged in the plane direction in 100 to 2,000 RGB dot units or a whole screen unit.

Thereby, it is possible to prevent the occurrence of the interference fringe by the random arrangement of the concave portions or convex portions.

Further, since random patterns formed of the concave portions or convex portions are arranged in 100 to 2,000 RGB dot units or the whole screen unit, it is possible to reduce the occurrence of stains of various shapes.

In making the mask of the present invention, preferably, a stripe-shaped random pattern of concave portions or convex portions in a row direction or in a column direction is formed, and repeated in a plurality of lines, to thereby form the plurality of concave or convex portions.

Thereby, even with little information, it is possible to form the random pattern of desirable reflectivity as a whole in a short time. Further, it is possible to obtain the random pattern of generally desirable reflectivity as a whole with good reproducibility by repeating a predetermined unit of the random pattern in a horizontal or vertical direction.

In making the substrate with the light reflective film of the present invention, preferably, the diameters of the concave portions or convex portions are any value within the range of 3 to 15 μm.

Thereby, it is possible to precisely control the planar shapes and the arrangement patterns of the concave portions or convex portions using an exposure process. Further, it is possible to properly scatter light so as to effectively prevent the occurrence of an interference fringe.

In making the substrate with the light reflective film of the present invention, preferably, the heights of the convex portions or the depths of the concave portions are any value within the range of 0.1 to 10 μm.

Thereby, it is possible to precisely control the planar shapes and the arrangement patterns of the concave portions or convex portions using an exposure process. Further, in case that the substrate with the light reflective film is used in liquid crystal display devices, etc., it is possible to properly scatter light so as to effectively prevent the occurrence of an interference fringe.

In making the substrate with the light reflective film of the present invention, preferably, the concave portions or convex portions have different diameters to form a plurality of kinds of light transmissive or non-transmissive portions.

Thereby, in case that the substrate with the light reflective film is used in the liquid crystal display device, it is possible to arrange the concave portions or convex portions more diversely. Further, it is possible to properly scatter light so as to effectively prevent the occurrence of the interference fringe.

In making the substrate with the light reflective film of the present invention, preferably, the base includes a first base and a second base formed from the bottom, the first base includes a plurality of concave portions or convex portions, and the second base includes a reflective layer thereon.

Thereby, in the case that the substrate with the light reflective film is used in a liquid crystal display device, it is possible to form the reflective layer having a relatively gently curved surface by disposing the continuously formed second base thereon, thereby further effectively preventing the occurrence of the interference fringe.

Another aspect of the present invention provides a method for manufacturing a substrate with a light reflective film including a base and a reflective film, comprising the steps of: (a) forming a first base including a plurality of concave portions or convex portions arranged randomly by performing an exposure process on an applied photosensitive resin using a mask in which light transmissive or non-transmissive portions are randomly arranged in the plane direction in 100 to 2,000 RGB dot units or a whole screen unit; (b) forming a second base including a plurality of continuous concave portions or convex portions by applying a photosensitive resin on the surface of the first base and subsequently performing an exposure process on the applied photosensitive resin; and (c) forming a reflective layer on the surface of the second base.

Thereby, it is possible to form the reflective layer with a comparatively gently curved surface by the first base including the concave portions or convex portions and the continuous second base. The above method can efficiently provide the substrate with the light reflective film which is easy to manufacture and reduces the occurrence of an interference fringe when used in liquid crystal display devices, etc.

Still another aspect of the present invention provides an optical display device comprising an optical element sandwiched between substrates and a light reflective film formed on the substrate provided opposite to the viewing side of the optical element, wherein the light reflective film includes a base and a reflective layer, and a plurality of concave portions or convex portions formed on the surface of the base are randomly arranged in the plane direction in 100 to 2,000 RGB dot units or a whole screen unit.

Thereby, since the light reflective film is properly scattered, it is possible to effectively prevent the occurrence of an interference fringe in the optical display device.

Further, since random patterns comprising the concave portions or convex portions are arranged in 100 to 2,000 RGB dot units or the whole screen unit, it is possible to reduce the occurrence of stains of various shapes.

In making the optical display device of the present invention, preferably, a light scattering film is provided on the substrate at the viewing side of the optical display device.

By using the light reflective film in combination with the light scattering film, it is possible to reduce the occurrence of stains of various shapes.

In making the optical display device of the present invention, preferably, a protective plate is provided on the viewing side of the optical element.

Thereby, it is possible to increase the mechanical strength of the optical display device, while improving the appearance of the optical display device.

Yet another aspect of the present invention provides an electronic apparatus including an optical display device with a light reflective film, wherein the light reflective film includes a base and a reflective layer, and a plurality of concave portions or convex portions formed on the surface of the base are randomly arranged in the plane direction in 100 to 2,000 RGB dot units or a whole screen unit.

Accordingly, such a light reflective film reflects light properly, and can reduce the occurrence of stains of various shapes and effectively prevent the occurrence of an interference fringe in the electronic apparatus.

Furthermore, the electronic apparatus comprising such a light reflective film has a comparatively flat surface so that it can realize a good appearance even additionally provided with a light scattering film and protective plate.

BRIEF DESCRIPTION OF THE DRAWINGS

FIGS. 7a and 7b show plan and cross-sectional views of a light reflective film including asymmetrical and substantially teardrop-shaped convex portions.

FIG. 11 is a flow chart of the process for manufacturing the light reflective film.

FIGS. 27*a*-27*e* illustrate the process for manufacturing a conventional liquid crystal display device.

DETAILED DESCRIPTION

Now, preferred embodiments of the present invention will be described in detail with reference to the drawings. It should be understood that the following embodiments are only for illustrating the present invention, and do not intend to limit the present invention in any way. Those skilled in the art will appreciate that various modifications are possible without departing from the scope and spirit of the invention.

FIRST EMBODIMENT

Figure 1:
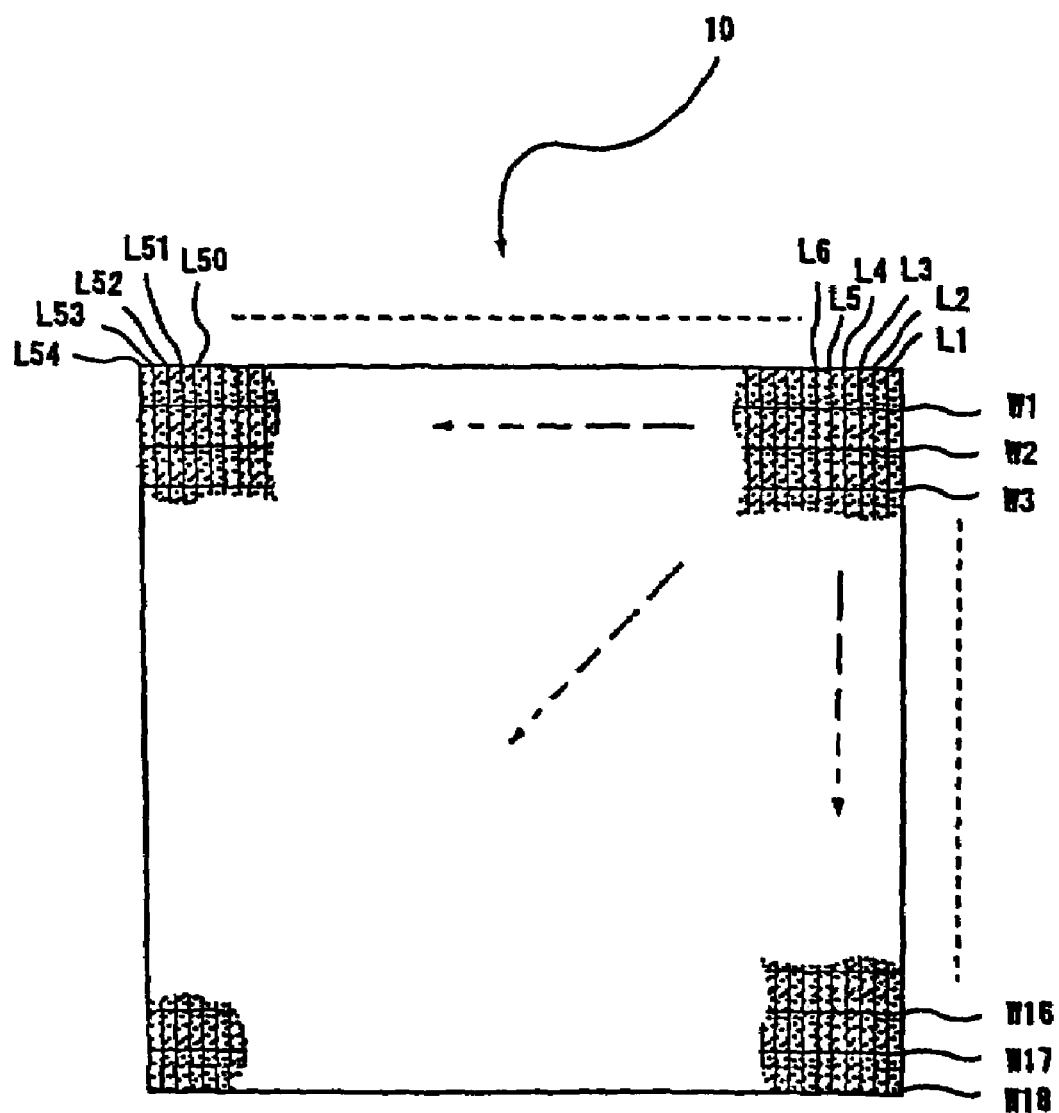
FIG. 1 is a plan view for explaining a mask in accordance with the present invention.

In a first embodiment of the present invention, as shown in FIG. 1, there is provided a mask 10 to manufacture a substrate with a light reflective film. The mask 10 includes light transmissive or non-transmissive portions randomly arranged in the plane direction in 100 to 2,000 RGB dot units or the whole screen unit. As shown in FIG. 1, a stripe-shaped random pattern in a plurality of rows W1 to W18 and in a plurality of columns L1 to L54 is formed and repeated in a plurality of lines to obtain the light transmissive or non-transmissive portions.

The random arrangement of the light transmissive or non-transmissive portions simply means a disorderly arrangement of the light transmissive or non-transmissive portions. More exactly, it means that in case that the mask is cut into a plurality of unit areas and the cut unit areas of the mask are stacked, patterns of the cut unit areas are completely different, or partially similar but not completely.

1. Light Transmissive or Non-transmissive Part (1) Shape

Preferably, the light transmissive or non-transmissive portions of the mask have planar shapes of independent or partially overlapped circles (including ovals) or polygons, or either thereof.

The reason is that when an exposure process is performed on the mask in order to manufacture the light reflective film, a resin can have a complicated structure of concave or convex portions by making the plane shapes of the light transmissive or non-transmissive portions circular or polygonal. This is also because the circular or polygonal shapes are basic figures, so the manufacture of the mask itself becomes easier. Incidentally, preferred polygons include tetragon, pentagon, hexagon, octagon, etc.

(2) Diameter and Pitch

Preferably, the diameters of the light transmissive or non-transmissive portions of the mask are any value within the range of 3 to 15 μm.

The reason is that when the diameters of the light transmissive or non-transmissive portions are below 3 μm, it is difficult to precisely control the planar shapes and the arrangement patterns of concave portions or convex portions, when an exposure process is preformed so as to manufacture the light reflective film. This is also because when the diameters of the light transmissive or non-transmissive portions are below 3 μm, it is sometimes difficult to manufacture the mask itself.

On the other hand, when the diameters of the light transmissive or non-transmissive portions exceed 15 μm, it is difficult to properly scatter light by the obtained light reflective film, thereby deteriorating the scattering property and the reflectivity.

Accordingly, preferably, the diameters of the light transmissive or non-transmissive portions of the mask are any value within the range of 3 to 15 μm, more preferably, within the range of 6 to 12 μm.

Preferably, the diameter of at least one of the light transmissive or non-transmissive portions of the mask is 5 μm or more. That is, in case that the diameters of the light transmissive or non-transmissive portions are different, when the diameter of at least one of the light transmissive or non-transmissive portions is set to be 5 μm or more, the diameter of the other light transmissive or non-transmissive portions may be below 5 μm.

The reason is that when the plane shapes of all the light transmissive or non-transmissive portions are circles or polygons have a diameter below 5 μm, the obtained light reflective film excessively scatters light, and reflects the light in a small degree. However, when the diameters of the light transmissive or non-transmissive portions are excessively large, the light scattering is reduced, thus causing the occurrence of an interference fringe.

In case that the light transmissive or non-transmissive portions are separately arranged on the mask, preferably, the pitch therebetween is any value within the range of 3.5 to 30 μm.

The reason is that when the pitch of the light transmissive or non-transmissive portions is below 3.5 μm, independency of the light transmissive or non-transmissive portions is sometimes decreased. On the other hand, when the pitch of the light transmissive or non-transmissive portions exceeds 30 μm, randomness of the arranged light transmissive or non-transmissive portions is sometimes decreased.

Accordingly, more preferably, the pitch of the light transmissive or non-transmissive portions of the mask is any value within the range of 5 to 20 μm, and most preferably, 7 to 15 μm.

The pitch of the light transmissive or non-transmissive portions of the mask denotes the center-to-center distance of neighboring light transmissive or non-transmissive portions, and is the mean value obtained by measuring 10 or more areas. In case that the light transmissive or non-transmissive portions of the mask overlap each other, the pitch is set to be smaller than the above value by several micrometers.

(3) Kind

Preferably, 2 to 10 kinds of light transmissive or non-transmissive portions are obtained by varying the diameters of the light transmissive or non-transmissive portions of the mask.

This is because it is possible to more efficiently manufacture the light reflective film with reduced occurrence of the interference fringe by providing such light transmissive or non-transmissive portions of different diameters. When the light reflective film is manufactured using such a mask, since the light transmissive or non-transmissive portions are more diversely arranged, it is possible to properly scatter light. Accordingly, in case that this light reflective film is used in liquid crystal display devices, it is possible to further effectively prevent the occurrence of the interference fringe.

Pattern combinations of the mask including the light transmissive or non-transmissive portions of different diameters are as follows:

1) A hexagonal pattern of 7.5 μm and a hexagonal pattern of 9 μm are combined,

2) A hexagonal pattern of 5 μm, a hexagonal pattern of 7.5 μm, and a hexagonal pattern of 9 μm are combined, or 3) A regular square pattern of 4.5 μm, a regular square pattern of 5 μm, a hexagonal pattern of 7.5 μm, a hexagonal pattern of 9 μm, and a hexagonal pattern of 11 μm are combined.

(4) Area Ratio

Preferably, the area ratio of the light transmissive or non-transmissive portions to the total area of the mask is any value within the range of 10 to 60%.

The reason is that when the area ratio is below 10%, in manufacturing the light reflective film, the area occupied by the concave portions or convex portions is reduced, thereby increasing the proportion of flat portions. Accordingly, the light scattering is remarkably reduced. When the area ratio exceeds 60%, the size of the flat portions is also increased, so the light scattering is remarkably reduced.

Accordingly, more preferably, the area ratio of the light transmissive or non-transmissive portions to the total area of the mask is any value within the range of 15 to 50%, and most preferably, 20 to 40%.

In case that a positive-type resin is used as the photosensitive resin for forming the base, a part of the resin on which light having passed the light transmissive portions is radiated, is photolyzed and becomes soluble in a developing agent, so the area ratio of the light permeable portions causes trouble. In case that a negative-type resin is used as the photosensitive resin, a part of the resin on which light having passed the light transmissive portions is radiated, is photocured and becomes insoluble in the developing agent, so the area ratio of the light transmissive portions causes trouble.

2. Random Arrangement (1) First Random Arrangement

In the first embodiment, as shown in FIG. 1, the light transmissive and non-transmissive portions are randomly arranged in the plane direction in 100 to 2,000 RGB dot units or a whole screen unit.

The reason is that when the number of the RGB dots in one unit is below 100, and the light reflective film is formed and used in the liquid crystal display device, stains having various shapes are seen. This is also because when the number of the RGB dots in one unit is below 100, the occurrence of the interference fringe is insufficiently suppressed.

However, when the number of RGB dots exceeds 2,000, the amount of information regarding the random patterns is excessively increased, and sometimes it is difficult to manufacture the mask. Accordingly, more preferably, the light transmissive and non-transmissive portions are randomly arranged in the plane direction in 300 to 1,500 RGB dot units, and most preferably 500 to 1,200 RGB dot units.

Table 1 below illustrates the relationship among the number of RGB dots of one unit, arrangement characteristics of the light transmissive or non-transmissive portions of the mask, and occurrence of interference fringe and visibility of stains when the obtained light reflective film is used in a liquid crystal display device.

Namely, in Table 1, the leftmost column shows the number of the RGB dots in one unit, i.e., 1 to 11,664. Results are obtained by comparatively estimating the occurrence of the interference fringe and the visibility of the stains in the liquid crystal display device in cases of the random and regular arrangements of the light transmissive or non-transmissive portions.

With reference to the obtained results, in case that the number of the RGB dots in one unit is comparatively large, for example, 192 to 11,664, the random arrangement of the light transmissive or non-transmissive portions suppresses the occurrence of the interference fringe and reduces the visibility of the stains.

In case that the number of the RGB dots in one unit is comparatively small, for example, 1 to 48, the suppression effect of the occurrence of the interference fringe is slightly decreased but the visibility of the stains is sometimes remarkably increased.

On the other hand, that the regular arrangement of the light transmissive or non-transmissive portions does not generate the stains, but remarkably generates interference fringes regardless of the number of RGB dots in one unit.

Accordingly, it can be said that in order to suppress the occurrence of the interference fringe and reduce the visibility of the stains, it is effective to randomly arrange the light transmissive and non-transmissive portions in the plane direction in 100 to 2,000 RGB dot units.

TABLE 1

|  | Random arrangement | | Regular arrangement | |
| --- | --- | --- | --- | --- |
| Number of RGB dots | Interference fringe | Stain | Interference fringe | Stain |
| 1 | ++ | + | ++++ | + |
| 3 | ++ | ++ | ++++ | + |
| 6 | + | ++++ | ++++ | + |
| 12 | + | +++ | ++++ | + |
| 48 | + | +++ | ++++ | + |
| 192 | + | ++ | ++++ | + |
| 972 | + | ++ | ++++ | + |
| 11,664 | + | + | ++++ | + |

| Estimation | Interference fringe/Stain |
| --- | --- |
| + | almost invisible level |
| ++ | somewhat visible level |
| +++ | clearly visible level |
| ++++ | remarkably visible level |

(2) Second Random Arrangement

Figure 2:
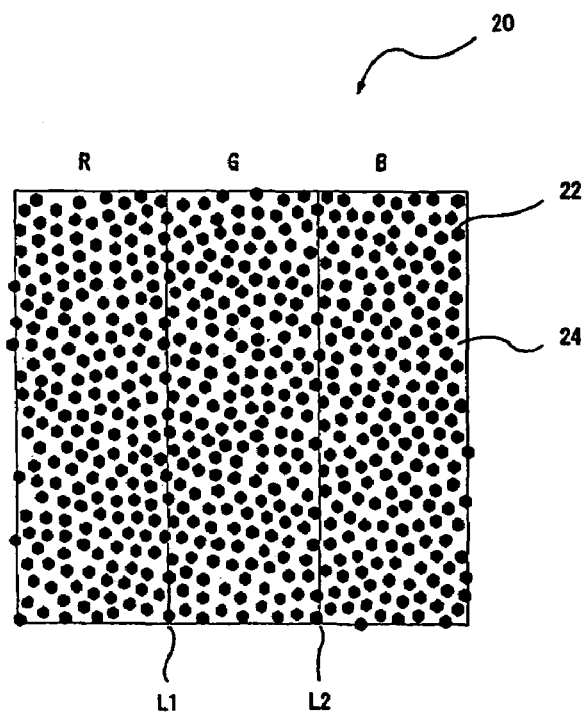
FIG. 2 is a plan view for explaining a mask in which light transmissive or non-transmissive portions are randomly arranged in the plane direction by one pixel unit (RGB: 3 dots).
Figure 3:
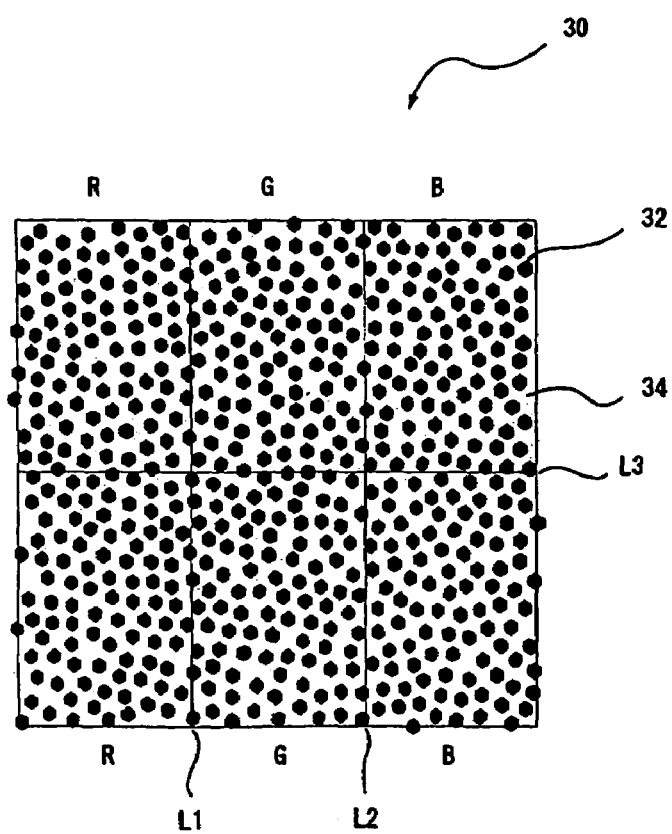
FIG. 3 is a plan view for explaining a mask in which light transmissive or non-transmissive portions are randomly arranged, in the plane direction by two pixel unit (RGB: 6 dots).
Figure 4:
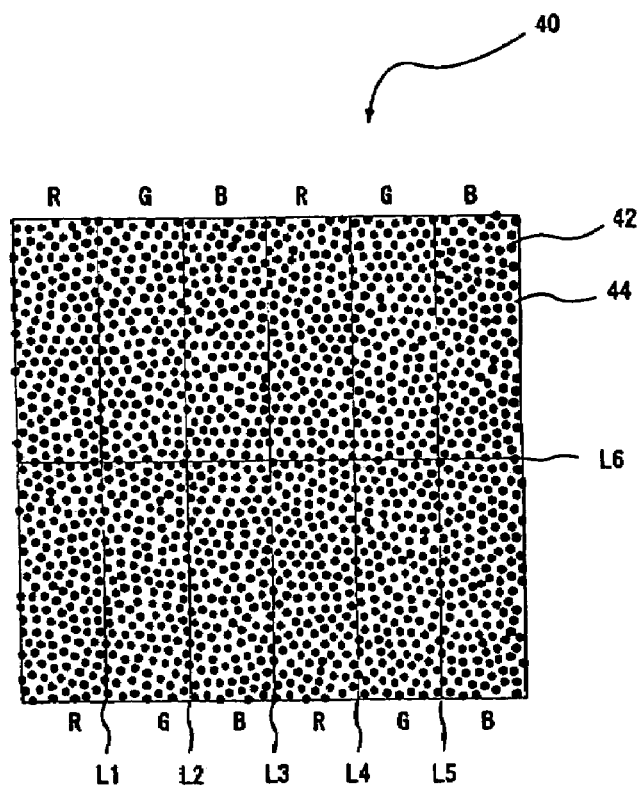
FIG. 4 is a plan view for explaining a mask in which light transmissive or non-transmissive portions are randomly arranged in the plane direction by three pixel unit (RGB: 12 dost).

In constructing the mask of the present invention, as shown in FIGS. 2 to 4, preferably, a random pattern of light transmissive or non-transmissive portions for 3 to 12 RGB dots is randomly arranged after being divided or as it is to form the light transmissive or non-transmissive portions in 100 to 2,000 RGB dot units or the whole surface unit.

Thereby, the required information regarding the patterns of the light transmissive portions of the light non-transmissive portions is comparatively reduced, and the mask having a large size of area is easily formed in a short time by repeating the prepared random pattern for 3 to 12 RGB dots.

In dividing the random pattern for 3 to 12 RGB dots of the light transmissive or non-transmissive portions as shown in FIGS. 2 to 4, the random pattern may be arbitrarily divided, or may be divided without arbitrary factors by using a random function or the like.

(3) Third Random Arrangement

Figure 5:
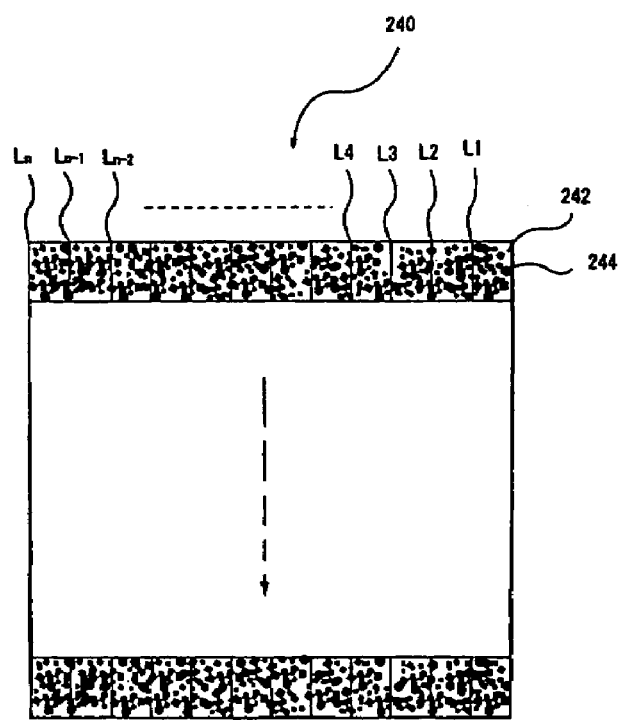
FIG. 5 is a plan view for explaining a mask in which light transmissive or non-transmissive portions are randomly arranged by one row line unit.

In constituting the mask of the present invention, as shown in FIG. 5, preferably, a stripe-shaped random pattern of one row or one column is formed and repeated in a plurality of lines to obtain the light transmissive or non-transmissive portions 244.

This is because by forming the stripe-shaped random pattern in any one row or column and repeating it appropriately, it is possible to effectively prevent the occurrence of the interference fringe due to the light reflective film, and it is also possible to design random patterns in a short time with desirable reflectivity as a whole based on small amount of information. For example, a mask for an LCD panel of 17 inches is equally divided in the horizontal direction by n (n is a natural number within the range of 2 to 1,000), the light transmissive or non-transmissive portions in the 1/n mask are allocated by using a random function, and such an operation is repeated n times, it is possible to obtain a random mask pattern for effectively preventing the occurrence of the interference fringe.

Moreover, it is possible to obtain the random patterns of desirable reflectivity as a whole with good reproducibility by repeating a predetermined unit of the random pattern in the horizontal or vertical direction.

SECOND EMBODIMENT

Figure 6:
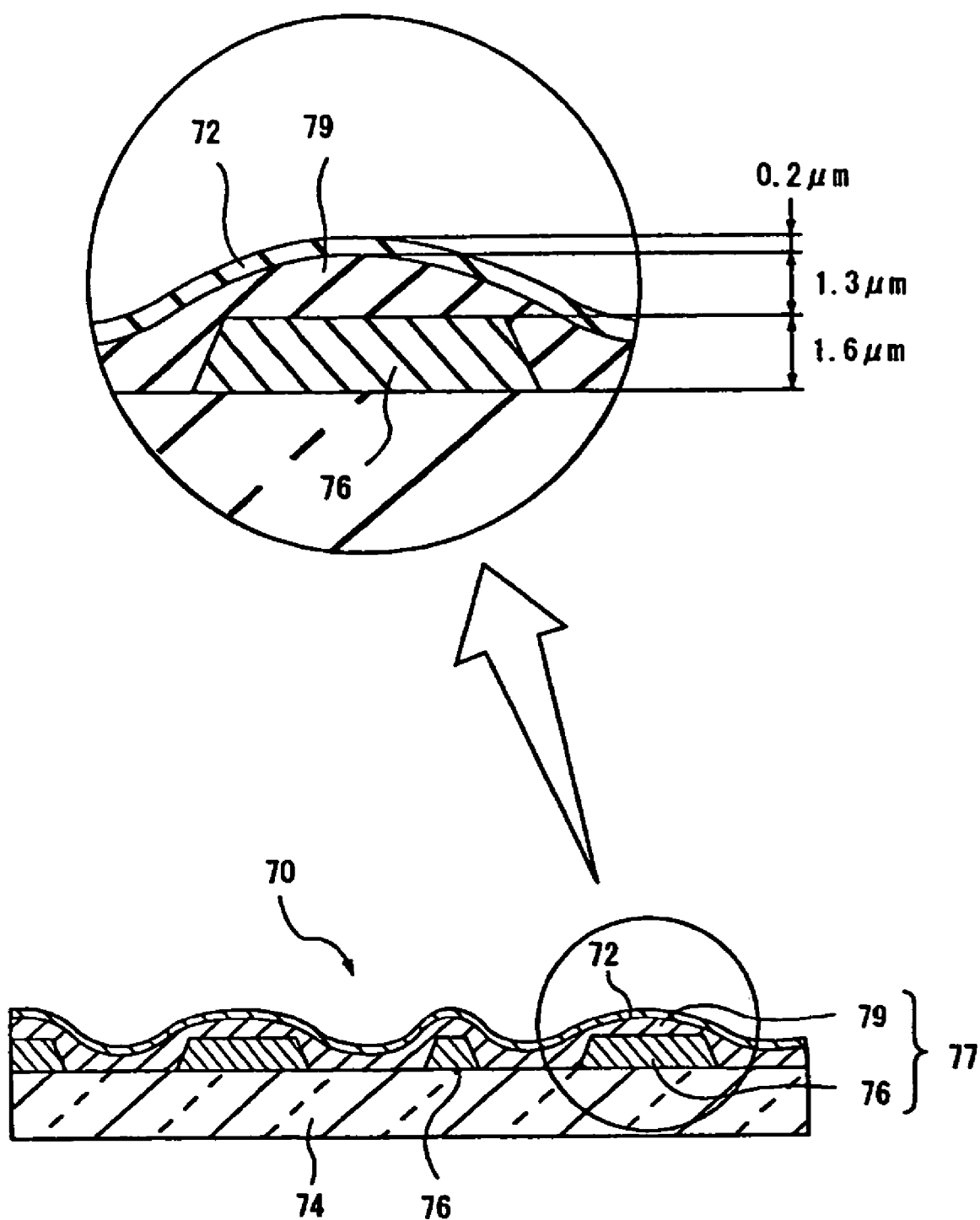
FIG. 6 is a cross-sectional view of a light reflective film including first and second substrates.

In a second embodiment of the present invention, as shown in FIG. 6, there is provided a substrate 70 provided with a light reflective film including a base 77 and a reflective layer 72. A plurality of convex portions 76 formed on the surface of the base 77 are randomly arranged in the plane direction in 100 to 2,000 RGB dot units or a whole screen unit. Herein, for example, a negative type photosensitive resin is used.

1. Base

As shown in FIG. 6, preferably, the base 77 includes a first base 76 and a second base 79 formed over the first base 76. The first base 76 includes a plurality of separated (independent) or partially overlapped convex portions, and the second base 79 is a continuous layer.

Thereby, it is possible to form a reflective layer 72 with a comparatively gently curved surface by disposing the continuous second base 79 on the first base 76. Accordingly, when the substrate 70 provided with the reflective layer 72 is used in liquid crystal display devices, etc., it is possible to effectively prevent the occurrence of the interference fringe. In case that the base includes the first and second bases, a plurality of the concave portions or convex portions on the base generally mean the concave portions or convex portions formed on the first base.

Hereinafter, as shown in FIG. 6, the base 77 including the first base 76 and the second base 79 formed from the bottom is described as a preferred example.

(1) First Base

Preferably, the heights of the convex portions or the depths of the concave portions of the first base are any value within the range of 0.5 to 5 μm.

The reason is that when the heights of the convex portions or the depths of the concave portions are below 0.5 μm, it is sometimes difficult to form the reflective layer with proper curved surface using the second base. On the other hand, when the heights of the convex portions or the depths of the concave portions exceed 5 μm, the unevenness of the reflective layer is increased, thereby causing the reflective layer to excessively scatter light, and causing wire breakages.

Accordingly, more preferably, the heights of the convex portions or the depths of the concave portions are any value within the range of 0.8 to 4 μm, and most preferably, 1 to 3 μm.

(2) Second Base

Preferably, the heights of the continuous convex portions or the depths of the continuous concave portions are any value within the range of 0.1 to 3 μm.

The reason is that when the heights of the convex portions or the depths of the concave portions are below 0.1 μm, it is difficult to form the reflective layer with proper curved surface. On the other hand, when the heights of the convex portions or the depths of the concave portions exceed 3 μm, the unevenness of the reflective layer formed thereon is increased, thereby causing the reflective layer to excessively scatter light, and causing wire breakages.

Accordingly, more preferably, the heights of the convex portions or the depths of the concave portions are any value within the range of 0.1 to 2 μm, and most preferably, 0.3 to 2 μm.

(3) A Plurality of Concave Portions or Convex Portions

① First Random Arrangement

A plurality of concave portions or convex portions formed on the surface of the base, particularly, a plurality of concave portions or convex portions constituting the first base are randomly arranged in the plane direction in 100 to 2,000 RGB dot units or the whole surface unit.

The reason is that when regularly formed concave portions or convex portions are employed in liquid crystal display devices, etc., an interference fringe occurs, thereby deteriorating display quality. In addition, when a plurality of concave portions or convex portions are randomly arranged in the plane direction in predetermined RGB dot units, if the number of the RGB dots in one unit is below 100, stains having various shapes are clearly visible in the liquid crystal display devices, etc. with such a substrate.

Accordingly, more preferably, the light transmissive and non-transmissive portions are randomly arranged in the plane direction in 300 to 1,500 RGB dot units, and most preferably 500 to 1,200 RGB dot units.

Preferably, the heights of the convex portions or the depths of the concave portions are the substantially equal to each other. As disclosed in Japanese Unexamined Patent Application Publication Nos. 6-27481 and 11-281972, this is because when the heights of the convex portions or the depths of the concave portions are different, it is difficult to manufacture the base provided with these portions and to reliably suppress the occurrence of the interference fringe.

② Planar Shape of Convex or Concave Portion

Preferably, the planar shapes of the concave portions or convex portions formed on the base are circles or polygons, which are arranged separately from each other or partially overlapped with each other, or either thereof.

The reason is that by making the plane shapes in this way, it is possible to precisely control the planar shapes and the arranged patterns of the concave portions or convex portions using an exposure process. The reason is also that it is possible to properly scatter light so as to effectively prevent the occurrence of an interference fringe.

As a preferred example of the planar shape of the convex or concave portion, FIG. 7(a) shows an offset oval shape (tear drop shape) and FIG. 7(b) shows an offset rectangular shape (oblique pyramid shape). FIGS. 17 to 21 show an oval dome shape, a tear drop shape, an oblique pyramid shape, a rectangular trough shape and a pyramid shape, respectively.

Figure 8:
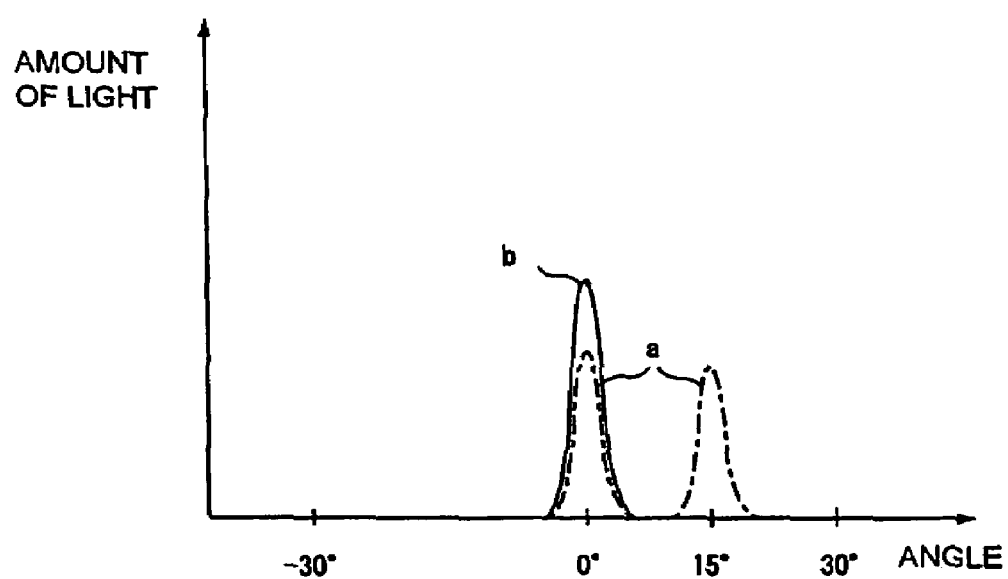
FIG. 8 is a graph illustrating the relationship between the amount of light to be displayed and the viewing angle of light.

The reason is that by making the planar shapes of the concave portions or convex portions asymmetric in this way, together with inclined planes in the height direction, the optical directivity can be improved while maintaining a designated light scattering property, as shown in FIG. 8. In FIG. 8, dotted line a denotes the amount of observed light in the case of offset oval shape shown in FIG. 7(a), and solid line b denotes the amount of observed light in the case of unoffset circular shape. In case that the concave portions or convex portions are viewed from a designated direction, for example, at a position of the angle +15°, the amount of light incident on the viewer's eyes is increased by the above-described asymmetrical planar shape. Accordingly, a bright image can be observed by a viewer at the above position.

③ Diameter of Concave Portion or Convex Portion

Preferably, the diameters of a plurality of the concave portions or convex portions formed on the base are any value within the range of 3 to 15 µm.

The reason is that it is possible to precisely control the planar shapes and the arranged patterns of the concave portions or convex portions using the exposure process. The reason is also that it is possible to properly scatter light and effectively prevent the occurrence of the interference fringe. Moreover, it is possible to reduce the visibility of the stains of irregular shapes.

Accordingly, more preferably, the diameters of the concave portions or convex portions formed on the base are any value within the range of 5 to 13 µm, and most preferably, 6 to 12 µm.

In addition, preferably, plural, for example, 2 to 10 kinds of concave portions or convex portions are obtained by varying their diameters. The reason is that it is possible to perform complicated optical reflection, which cannot be obtained by using one kind of the concave portions or convex portions, thereby more effectively scattering light. Accordingly, it is possible to effectively prevent the occurrence of the interference fringe by providing a plurality of the concave portions or convex portions of different diameters.

④ Height of Convex Portion or Depth of Concave Portion

Preferably, the heights of the convex portions or the depths of the concave portions are any value within the range of 0.1 to 10 µm.

The reason is that when the heights of the convex portions or the depths of the concave portions are below 0.1 µm, the unevenness of the substrate is reduced even using the exposure process, thereby deteriorating the light scattering characteristics. On the other hand, when the heights of the convex portions or the depths of the concave portions exceeds 10 µm, the unevenness of the substrate is increased, thereby excessively scattering light or causing wire breakages.

Accordingly, more preferably, the heights of the convex portions or the depths of the concave portions are any value within the range of 0.2 to 3 µm, and most preferably, 0.3 to 2 µm.

(4) Opening

Preferably, openings for partially passing light therethrough are formed on the light reflective film. Thereby, it is possible to allow the light reflective film to be used in transflective type liquid crystal display devices, etc.

Figure 9:
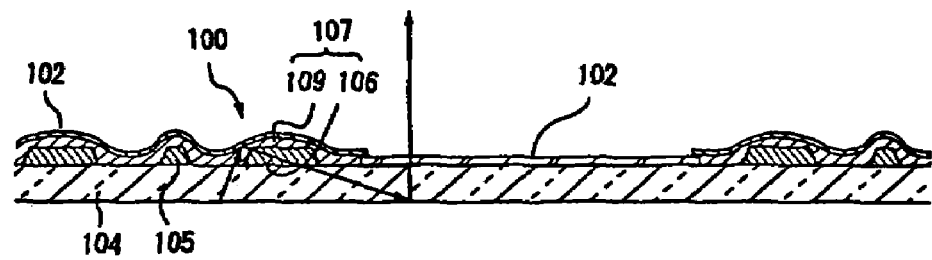
FIG. 9 is a cross-sectional view of a light reflective film with openings.

As shown in FIG. 9, an opening 102 is formed on a part of the light reflective film 100. Accordingly, external light can be effectively reflected by a light reflective film 100, and light from the inside can be also effectively emitted to the outside through the opening 102.

The size of opening 102 is not particularly limited, but may be variably modified according to the use of the light reflective film. For example, assuming that the size of the light reflective film is 100%, preferably, the total size of the openings is any value within the range of 5 to 80%, more preferably 10 to 70%, and most preferably 20 to 60%.

2. Reflective Layer (2) Thickness

Preferably, the thickness of the reflective layer of the light reflective film is any value within the range of 0.05 to 5 µm.

The reason is that when the thickness of the reflective layer is below 0.05 µm, the light reflection effect is remarkably reduced. On the other hand, when the thickness of the reflective layer exceeds 5 µm, the flexibility of the obtained light reflective film is reduced, and thereby the manufacturing time of the light reflective film is sometimes prolonged.

Accordingly, more preferably, the thickness of the reflective layer of the light reflective film is any value within the range of 0.07 to 1 µm, and most preferably, 0.1 to 0.3 µm.

(2) Kind

The material of the reflective layer is not particularly limited. For example, the reflective layer is made of a metal having excellent conductivity and optical reflectivity such as aluminum (Al), silver (Ag), copper (Cu), gold (Au), chromium (Cr), tungsten (W), nickel (Ni), etc.

It is also preferred that a transparent electrode material such as Indium Tin Oxide (ITO) or indium oxide, or tin oxide is used on the reflective layer.

However, in using these metal materials and transparent conductive materials, if they merge in the liquid crystal, preferably, an electrical insulating film is formed on the surface of the reflective film made of such metal material, an electrical insulator is preferably sputtered together with the metal material on the reflective film.

(3) Base Layer

In forming the reflective layer on the second substrate, preferably, a base layer having the thickness of 0.01 to 2 µm is formed on the second substrate so as to improve the attachment of the reflective layer and the second substrate and form a smoothly curved surface of the reflective layer.

Material of the base layer includes a single or combination of two or more components such as a silane coupling agent, a titanium coupling agent, an aluminum coupling agent, an aluminum-magnesium alloy, an aluminum-silane alloy, an aluminum-copper alloy, and an aluminum-manganese alloy, an aluminum-gold alloy, etc.

(4) Mirror Reflectivity

Preferably, the mirror reflectivity in the reflective layer is any value within the range of 5 to 50%.

The reason is that when the mirror reflectivity of the reflective layer is below 5%, and the reflective layer is used in liquid crystal display devices, etc., the brightness of an obtained display image is sometimes remarkably reduced.

On the other hand, when the mirror reflectivity of the reflective layer exceeds 50%, the light scattering is reduced so that background reflects or external light is excessively reflected by the reflective layer.

Accordingly, more preferably, the mirror reflectivity of the reflective layer is any value within the range of 10 to 40%, and most preferably, 15 to 30%.

3. Combination with Other Constitutional Members

Figure 13:
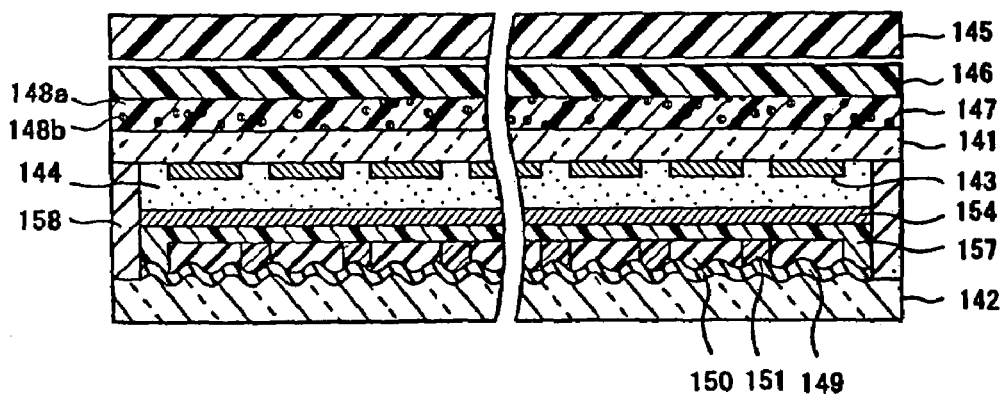
FIG. 13 is a cross-sectional view showing the constitution of a passive matrix liquid crystal display device.
Figure 14:
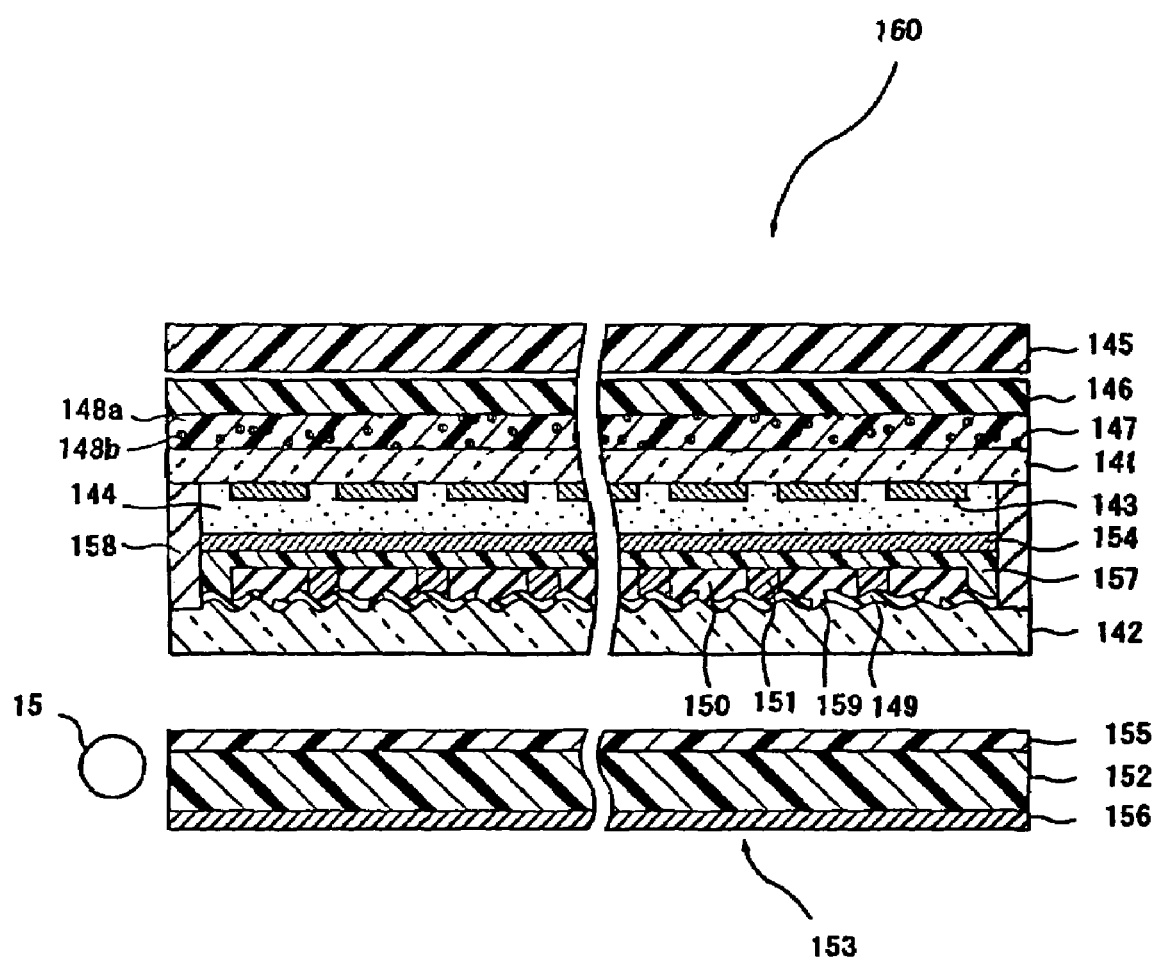
FIG. 14 is a cross-sectional view showing the constitution of another liquid crystal display device.

Preferably, the above-described light reflective film is combined with other constitutional members, for example, a color filter 150, a light-shielding layer 151, an overcoat layer 157, a plurality of transparent electrodes 154, and an orientation film, as shown in FIGS. 13 and 14.

Such combination makes it possible to effectively provide members of color liquid crystal display devices, etc., with reduced occurrence of interference fringes. For example, by combining with the color filters 151 of a stripee-type, mosaic-type, or delta-type arrangement of three chrominance components of RGB (red, green, and blue), colorization is easily realized. Further, in combination with the light-shielding layer 151, it is possible to obtain an image having an excellent contrast. The light reflective film can be also used as a reflective electrode, however, by providing other electrodes, for example, the transparent electrode 154, it becomes possible to avoid the influence of the reflective film due to the plurality of the concave portions or convex portions while preventing light absorption.

Further, preferably, the color filter is formed by three chrominance components of YMC (yellow, magenta, and cyan). Such a color filter is excellent in light transmittance and can achieve a brighter display when used in a reflective-type liquid crystal display device.

THIRD EMBODIMENT

In a third embodiment, there is provided a method for manufacturing a light reflective film including a base and a reflective layer. The method comprises the steps of: (a) forming a first base including a plurality of concave portions or convex portions by performing an exposure process on an applied photosensitive resin using a mask in which light transmissive or non-transmissive portions are randomly arranged in the plane direction in 100 to 2,000 RGB dot units or a whole screen unit; (b) forming a second base including a plurality of continuous concave portions or convex portions by applying a photosensitive resin on the surface of the first base and subsequently performing an exposure process on the applied photosensitive resin; and (c) forming a reflective layer on the surface of the second base.

Figure 10:
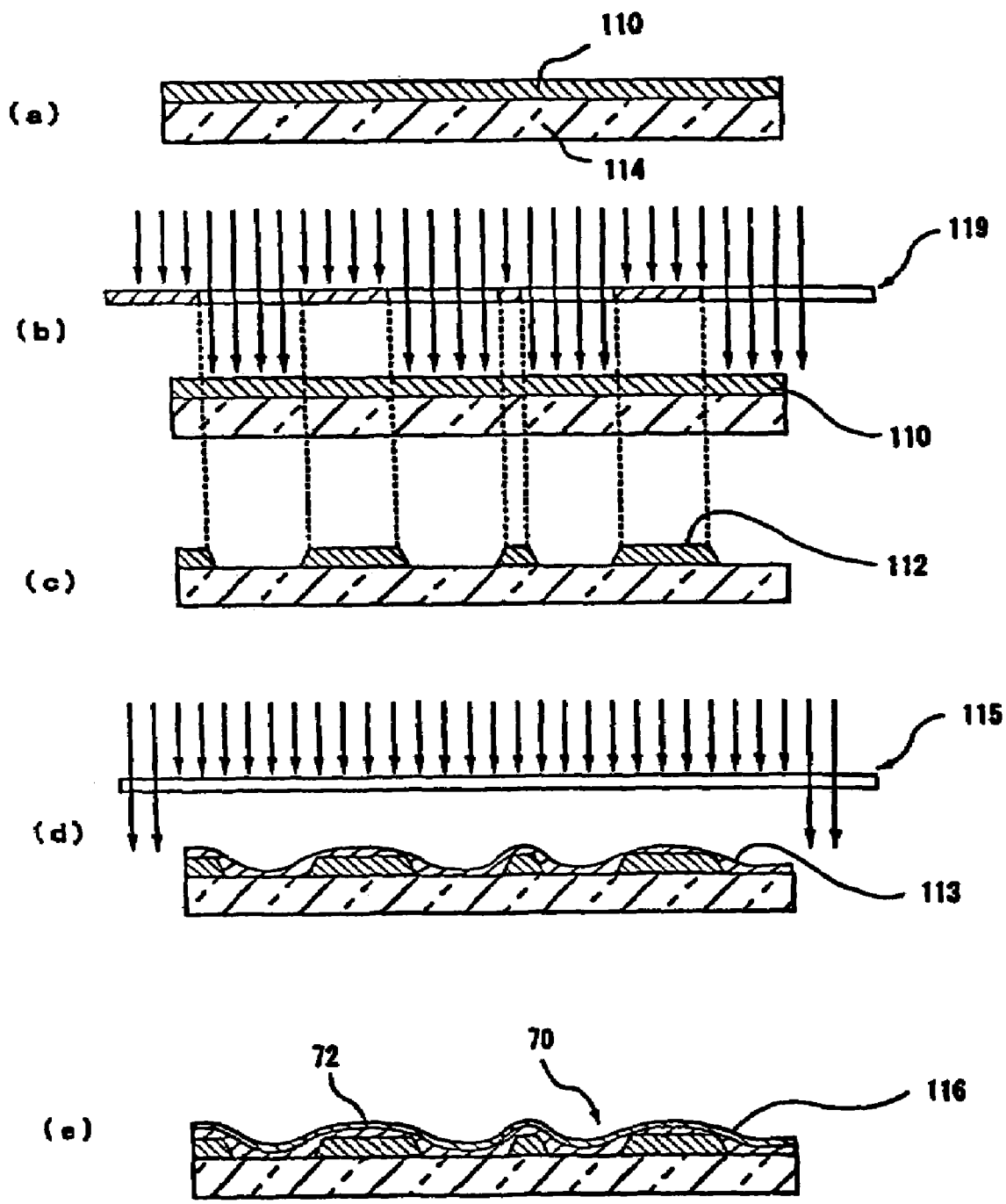
FIGS. 10a-10e illustrate the process for manufacturing a light reflective film.
Figure 12:
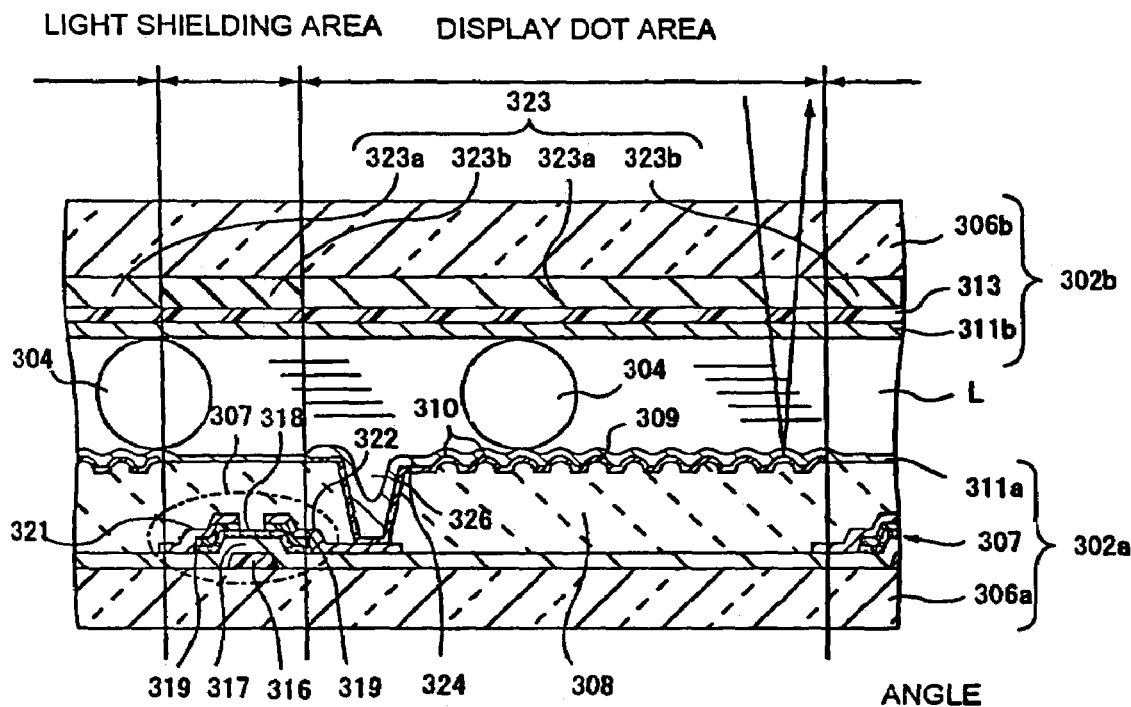
FIG. 12 is a cross-sectional view for explaining the configuration a light reflective film electrically connected to a TFT element.

Hereinafter, with reference to FIGS. 10 and 11, the method for manufacturing the light reflective film (the substrate with the light reflective film), in which convex portions are formed on the surface of the first base, is described in detail. FIG. 10 is a schematic view illustrating the process for manufacturing the light reflective film, and FIG. 11 is a flow chart of such a manufacturing process.

1. Step of Forming First Base

Preferably, a plurality of concave portions or convex portions which are randomly arranged in the plane direction are formed from a photosensitive resin by the exposure process using the mask as described in the first embodiment.

That is, the randomly arranged concave portions or convex portions are formed from a photosensitive resin, for example, a positive-type photosensitive resin, using the mask in which the light transmissive or non-transmissive portions having separate or partly overlapped circular and polygonal planar shapes, or either thereof are randomly arranged.

(1) Photosensitive Resin

The kind of photosensitive resin constituting the first base is not particularly limited. For example, the photosensitive resin may be single or a combination of two or more of acryl-based resin, epoxy-based resin, silicon-based resin, phenol-based resin, oxetane-based resin, etc.

Preferably, an inorganic filler such as silica particles, titanium oxide, zirconium oxide, aluminum oxide, etc. is added to the photosensitive resin to thereby achieve precisely a designated shape such as a circle or a polygon.

Incidentally, as described above, there are two types of photosensitive resins allowed to be used for forming the first base; a positive-type resin, light radiated area of which is photolyzed and becomes soluble in a developing agent, and a negative-type resin, light radiated area of which is photocured and becomes insoluble in the developing agent. Both types of photosensitive resins can be suitably used.

(2) Exposure Process

As shown in FIG. 10(a) and at step P31 of FIG. 11, in forming a first base 112, preferably, a photosensitive resin constituting the first base is applied uniformly on a supporting portion 114 using a spin coater, or the like to form a first layer 110. Here, preferably, the spin coater is operated under the condition of 600 to 2,000 rpm for 5 to 20 seconds.

Next, in order to improve resolution, as shown at step P32 of FIG. 11, the first layer 110 is preferably pre-baked. Here, preferably, the first layer 110 is heated using a hot plate at the temperature of 80 to 120° C. for 1 to 10 minutes.

Next, as shown in FIG. 10(b) and at step P33 of FIG. 11, preferably, the first base 112 including the separated or partially overlapped concave portions or convex portions randomly arranged is formed by an exposure process using the mask 119 of the first embodiment. That is, the mask 119 of the first embodiment is put on the first layer 110 made of the uniformly applied photosensitive resin, and then is preferably exposed to an i-ray, for example. Here, preferably, the exposure to the i-ray, etc. is any value within the range of 50 to 300 mJ/cm$^2$.

Then, as shown in FIG. 10(c) and at step P34 of FIG. 11, a development process, for example a positive development process, using a developing agent is carried out to obtain the first base 112 including the concave portions or convex portions, which are randomly arranged separately from each other or partially overlapped with each other.

It is also preferable that, prior to the formation of a second base 113, as shown at step P35 of FIG. 11, a post-exposure process is performed on the whole surface of the first base 112 with exposure of, for example, 300 mJ/cm$^2$, and then a post-baking is performed on the first base 112 by heating it at the temperature of 220° C. for 50 minutes, thereby further hardening the first base 112.

2. Step of Forming Second Base

At the step of forming the second base, the second base as a continuous layer is formed on the first base, i.e., on the randomly arranged convex portions, by applying a resin, etc.

(1) Photosensitive Resin

The kind of the photosensitive resin constituting the second base is not particularly limited. For example, the photosensitive resin may be a single or a combination of two or more of acryl-based resin, epoxy-based resin, silicon-based resin, phenol-based resin, etc.

In order to improve the attachment between the first and second bases, preferably, the first and second bases are made of the same kind photosensitive resin.

Further, in order to improve the attachment between the first and second bases, a treatment using a silane coupling agent, etc. is preferably performed on the surface of the first base.

(2) Exposure Process

As shown in FIG. 10(d) and at steps P37 to P40 of FIG. 11, preferably, the second base 113 is formed by applying the photosensitive resin, and exposing the resin at a mounting area around a panel display area to an i-ray, etc., to remove the resin layer. Here, like the exposure process of the first base 112, preferably, the exposure to an i-ray, etc. is any value within the range of 50 to 300 mJ/cm$^2$.

As shown at steps P41 and P42 of FIG. 11, after the formation of the second base 113, preferably, a post-exposure process is performed on the whole surface of the second base 113 with the exposure of 300 mJ/cm$^2$, for example. Then, the second base 113 is post-baked by heating it at the temperature of 220° C. for 50 minutes, thereby hardening the first and second bases 112, 113.

3. Step of Forming Reflective Layer

As shown in FIG. 10(e) and at steps P43 and P44 of FIG. 11, the reflective layer 116 having a smoothly curved surface is formed on the surface of the second base 113 so that light is properly scattered by the reflective layer 116.

(1) Material of Reflective Layer

As described in the second embodiment, preferably, a metal having excellent light reflectivity such as aluminum (Al) and silver (Ag) is used as the material of the reflective layer.

(2) Forming Method

Preferably, the reflective layer is formed using a sputtering method, etc. Herein, the reflective layer material located at other areas except a desired area can be removed by a photo-etching method, etc.

Since the surface of the second base is uneven, in case that the deposited reflective layer material has a non-uniform thickness, a rotational evaporation method or a rotational sputtering method is preferably employed.

Preferably, when the reflective layer is formed, the reflective layer is electrically connected to terminals of a TFT (Thin Film Transistor) and a MIM (Metal Insulating Metal), etc.

FOURTH EMBODIMENT

In a fourth embodiment of the present invention, there is provided an active matrix type liquid crystal display device using a TFD (Thin Film Diode) which is a diode-type active element as an active element. The active matrix liquid crystal display device comprises a liquid crystal element sandwiched between two substrates, and a substrate with a light reflective film attached to the substrate provided opposite to the viewing side of the liquid crystal element. The substrate with the light reflective film includes a base and a light reflective layer. A plurality of concave portions and convex portions formed on the base are randomly arranged in 100 to 2,000 RGB dot units or a whole screen unit.

Hereinafter, with reference to FIGS. 22 to 24, there will be exemplarily described in detail a transflective type liquid crystal display device which can selectively perform a reflective display using external light and a transmissive display using an illuminator.

Figure 22:
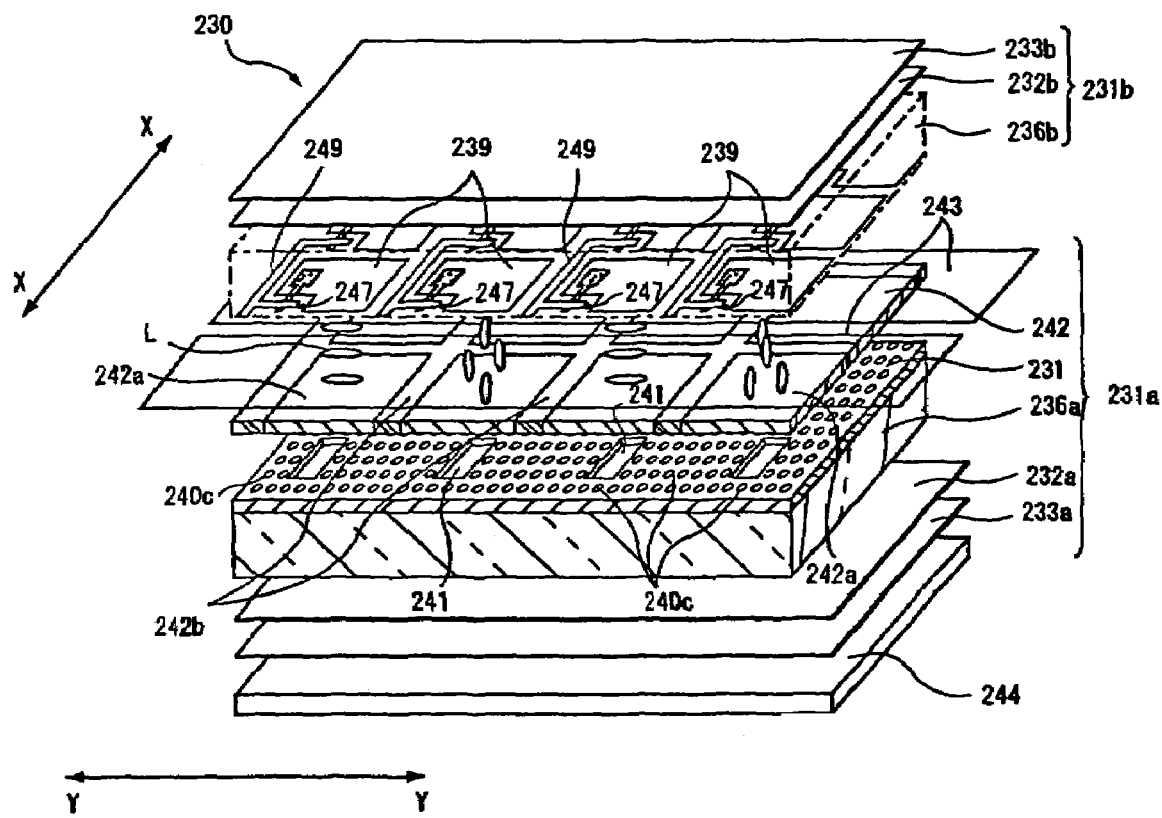
FIG. 22 is an exploded perspective view of a TFD type liquid crystal display device.

In accordance with the fourth embodiment of the present invention, as shown in FIG. 22, a liquid crystal display device 230 is formed by attaching a first substrate 231a and a second substrate 231b to each other using a sealant (not shown) applied at their perimeters, and subsequently injecting a liquid crystal into a gap, i.e., a cell gap, surrounded by the first substrate 231a, the second substrate 23ab and the sealant. Preferably, a liquid crystal activating IC (not shown) is mounted directly on the surface of the second substrate 231b, for example, by COG (Chip on Glass) method.

Figure 23:
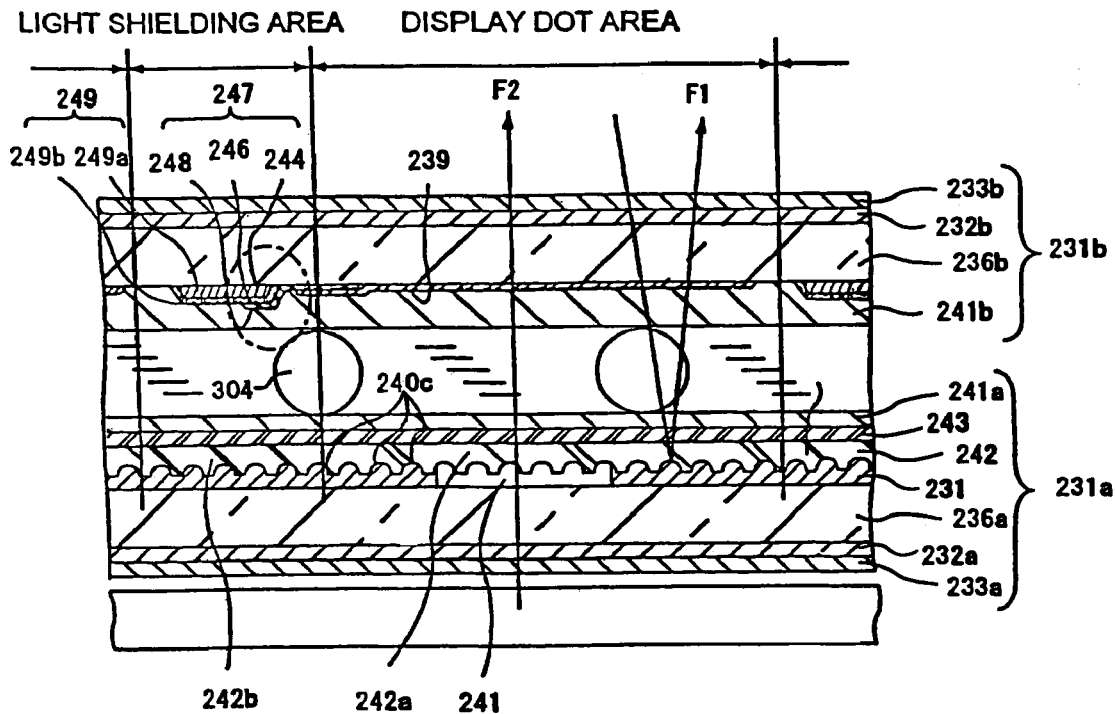
FIG. 23 is a partial cross-sectional view of the TFD type liquid crystal display device.
Figure 24:
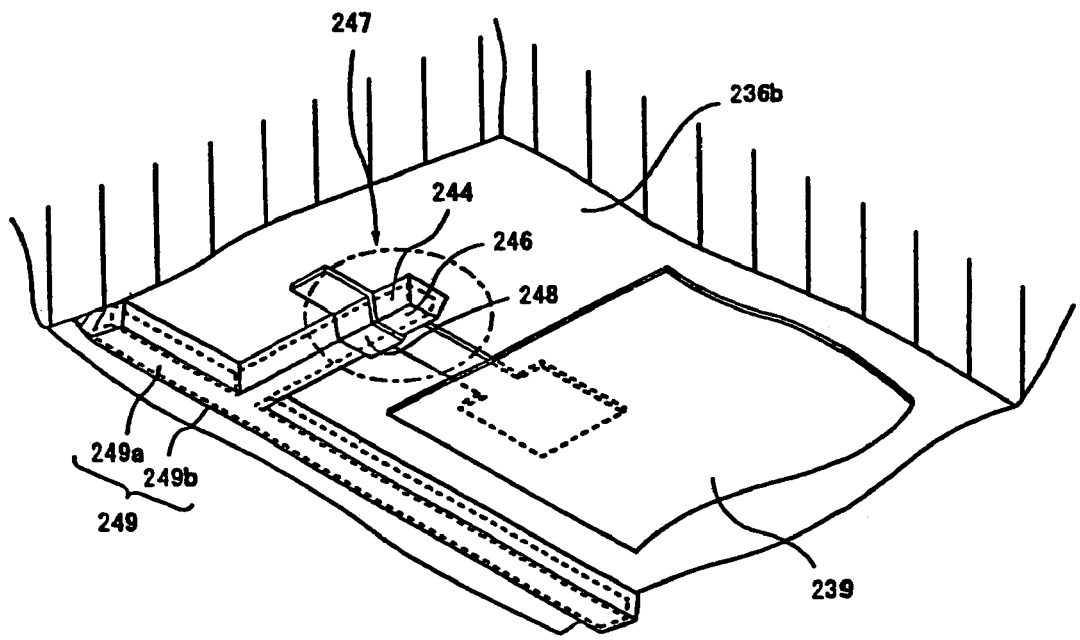
FIG. 24 is a partial perspective view of the TFD type liquid crystal display device.
Figure 25:
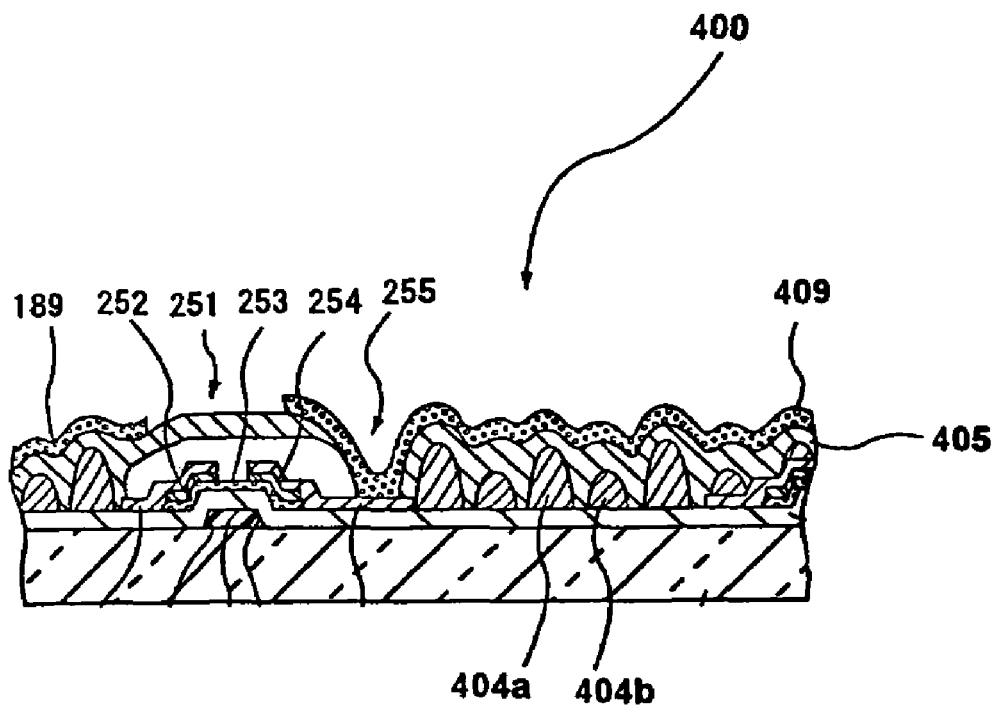
FIG. 25 is a cross-sectional view showing the constitution of a conventional liquid crystal display device.
Figure 26:
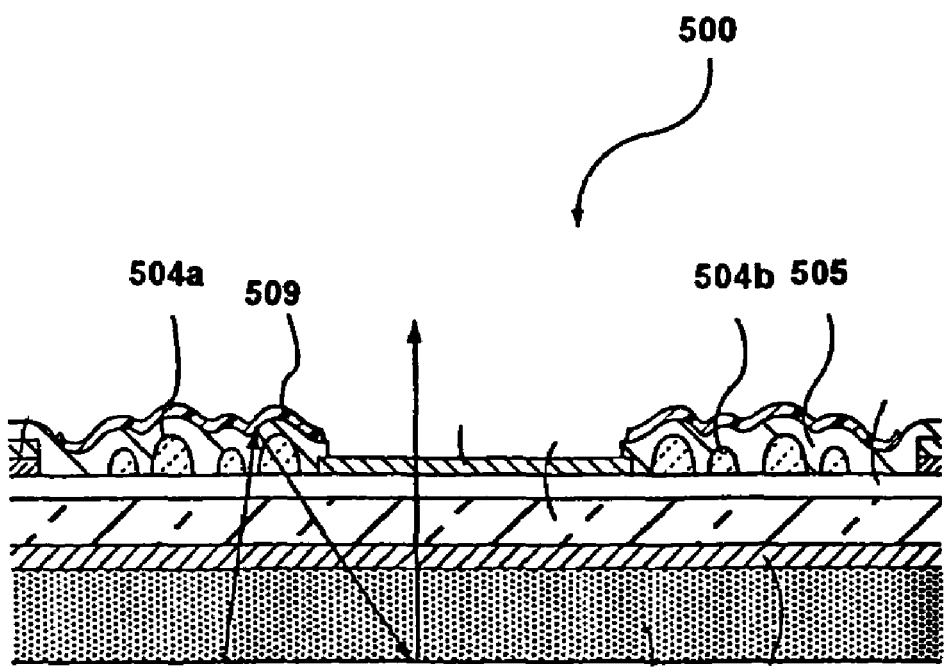
FIG. 26 is a cross-sectional view showing the constitution of another conventional liquid crystal display device.

FIG. 22 shows an enlarged cross-sectional view illustrating several dots among a plurality of display dot constituting one display area of the liquid crystal display 230, and FIG. 23 shows a cross-sectional view illustrating one display dot.

As shown in FIG. 22, a plurality of pixel electrodes are formed in a dot matrix shape in a row direction of X-X and a column direction of Y-Y within the area of the second substrate 231b surrounded by the sealant. An electrode is in a stripee shape formed within the area of the first substrate 231a surrounded by the sealant. Such a stripe-shaped electrode of the first substrate 231a is provided opposite to the plurality of the pixel electrodes of the second substrate 231b.

A portion surrounded by the stripee-shaped electrode on the first substrate 231a and one of the pixel electrodes on the second substrate 231b with a liquid crystal therebetween forms one display dot. A display area is constituted by a plurality of the display dots arranged in a dot matrix shape within the area surrounded by the sealant. The liquid crystal activating IC applies selectively a scan signal and a data signal to the opposite electrodes within the plurality of display dots, thereby controlling the orientation of the liquid crystal per a display dot. That is, light passing through the liquid crystal is modulated by controlling the orientation of the liquid crystal. Accordingly, an image such as a character and a number is displayed within the display area.

In FIG. 23, the first substrate 231a comprises a base 236a made of glass, plastic, etc., a light reflective film 231 formed on the inner surface of the base 236a, a color filter 242 formed on the light reflective film 231, and a transparent stripee-shaped electrode 243 formed on the color filter 242. An oriented film 241a is formed on the stripee-shaped electrode 243. As an orientation treatment, a rubbing treatment is performed on the oriented film 241a. The stripee-shaped electrode 243 is made of a transparent conductive material such as ITO (Indium Tin Oxide), etc.

Further, the second substrate 231b, provided opposite to the first substrate 231a, comprises a base 236b made of glass, plastic, etc., a TFD (Thin Film Diode) 247 as an active element serving as a switching element, formed on the inner surface of the base 236b, and a pixel electrode 239 connected to the TFD 247. An orientation film 241b is formed on the TFD 247 and the pixel electrodes 239. A rubbing treatment as an orientation treatment on the orientation film 241b is performed. The pixel electrode 239 is made of transparent conductive material such as ITO (Indium Tin Oxide), etc.

The color filter 242 of the first substrate 231a includes a filter element 242a made of one of various chrominance components such as R (red), G (green) and B (blue), or Y (yellow), M (magenta), C (cyan) and, etc., at an opposing position to the pixel electrode of the second substrate 231b. Preferably, the color filter 242 includes a black mask 242b at a position not facing the pixel electrode 239.

As shown in FIG. 23, the size of the gap, i.e., the cell gap, between the first substrate 231a and the second substrate 231b is maintained by ball-shaped spacers 304 dispersed on the surface of any one of the two substrates 231a and 231b. The liquid crystal is enclosed within such a cell gap.

Here, the TFD 247, as shown in FIG. 23, includes a first metal layer 244, an insulating layer 246 formed on the surface of the first metal layer 244, and a second metal layer 248 formed on the insulating layer 246. As such, the TFD 247 has a laminated structure of the first metal layer/the insulating layer/the second metal layer, what is called a MIM (Metal Insulator Metal) structure.

Further, the first metal layer 244 is made of, for example, tantalum (Ta) or a tantalum (Ta) alloy. In case that the first metal layer 244 is made of a tantalum (Ta) alloy, or elements belonging to groups 6 to 8 in the periodic table, such as tungsten, chromium, molybdenum, rhenium, yttrium, lanthanum, dysprosium are added to tantalum as a principal element.

The first metal layer 244 is formed integrally with a first layer 249a of a line wiring 249. The line wiring 249 is formed in stripees with the pixel electrode 239 therebetween. The line wiring 249 serve as a scanning line for providing a scan signal to the pixel electrode 239, or as a data line for providing a data signal to the pixel electrode 239.

The insulating layer 246 is made of, for example, tantalum oxide ($Ta_2O_5$) obtained by oxidizing the surface of the first metal layer 244 by an anodizing method. When the first metal layer 244 is anodized, the surface of the first layer 249a of the line wiring 249 is oxidized simultaneously. Thereby, a second layer 249b made of tantalum (Ta) is formed.

Further, the second metal layer 248 is made of, for example, a conductive material such as chromium (Cr). The pixel electrode 239 is formed on the surface of the base 236b such that a part of the pixel electrode 239 is overlapped with the leading end of the second metal layer 248. A base layer made of tantalum oxide, etc., is sometimes formed on the surface of the base 236b before the first metal layer 244 and the first layer 249a of the line wiring 249 are formed on the base 236b. Such a base layer prevents the first metal layer 244 from being separated from the base substrate by heating treatment after the stacking of the second metal layer 248, and prevents impurities from being scattered in the first metal layer 244.

Then, the light reflective film 231, which is formed on the first substrate 231a, is made of, for example, a metal having light reflectivity such as aluminum (Al). The light reflective film 231 includes openings 241 for transmissive light, formed at a position corresponding to each of the pixel electrodes 239 belonging to the second substrate 231b, i.e., display dot. Preferably, elongated dome-shaped mountain or valley portion 80, 84, 180, 190, 200, 210 and 220 as shown in FIGS. 17 to 21, for example, are formed on the surface of the light reflective film 231 facing the liquid crystal. That is, the mountain or valley portions 80, 84, 180, 190, 200, 210, 220 are preferably arranged such that the X axis along which the line wiring extends is their major axis, and the Y axis which is orthogonal to the X axis is their minor axis. Further, it is preferable that the major axis X of the mountain or valley portions 80, 84, 180, 190, 200, 210, 220 is set to be parallel with an end side of the base which extends in the direction X-X, and the minor axis Y is set to be parallel with an end of the base which extends in the direction Y-Y.

The liquid crystal display device 230 of the fourth embodiment has the above-described structure. In case that the liquid crystal display device 230 performs a reflection type display, as shown in FIG. 23, external light from the viewer's side of an external viewer, i.e., from the second substrate 231b side, enters the inside of the liquid crystal display device 230, passes through the liquid crystal, and subsequently reaches the light reflective film 231. Then, the external light is reflected by the light reflective film 231, and returned to the liquid crystal (refer to arrow F1 in FIG. 23). By a voltage applied between the pixel electrodes 239 and the stripee-shaped electrode 243, i.e., by a scan signal and a data signal, the orientation of the liquid crystal is controlled in every display dot unit. Thereby, the reflected light provided to the liquid crystal is modulated in every display dot unit, thus allowing an image such as a character and a number to be displayed to the viewer.

On the other hand, in case that the liquid crystal display device 230 performs a transmission type display, an illuminator (not shown), i.e., a back light which is located outside the first substrate 231a, emits light. The emitted light passes through a polarizing plate 233a, a phase difference plate 232a, the base 236a, the opening 241 of the light reflective film 231, the color filter 242, the electrode 243, and the orientation film 241a, and is subsequently provided to the liquid crystal (refer to arrow F2 in FIG. 23). Thereafter, the transmission type display is performed similarly in the reflection type display.

In the fourth embodiment, since a plurality of concave portions or convex portions are randomly arranged in the plane of the base of the substrate with the light reflective film in 100 to 2,000 RGB dot units or the whole screen unit, it is possible to reduce an interference fringe.

Further, in the fourth embodiment, as described above, in case that the three-dimensional shapes of the plurality of concave portions or convex portions along the X axis and the three-dimensional shapes of the plurality of concave portions or convex portions along the Y axis are different from each other, the amount of the light reflected at a certain viewing angle can be reduced while increasing the amount of the light reflected at other viewing angles. As a result, a viewer can see a brighter image displayed within the display area of the liquid crystal display device at a specific viewing angle in the reflection type display using the light reflective film.

FIFTH EMBODIMENT

In a fifth embodiment of the present invention, a liquid crystal display device is provided comprising a liquid crystal element sandwiched between two substrates, and a light reflective film formed on a substrate located at the opposite side to the viewing side of the liquid crystal element. The light reflective film includes a base and a reflective layer. A plurality of concave portions or convex portions formed on the base are randomly arranged in the plane direction in a 100 to 2,000 RGB dots units or the whole screen unit.

Hereinafter, with reference to FIG. 13, a passive matrix reflective-type liquid crystal display device of the fifth embodiment is described in detail. Herein, enlargement scale of each layer and each member in the drawings may be different to show them in a recognizable size.

1. Constitution

As shown in FIG. 13, a liquid crystal display device 140 has a configuration such that a first substrate 141 and a second substrate 142 facing each other, are attached by a sealant 158, and a liquid crystal 144 is injected between the two substrates. A light transmissive protective plate 145 is located on the viewing side of the liquid crystal display device 140. The protective plate 145 is a plate-shaped member to protect the liquid crystal display device 140 from external impact. For example, the protective plate 145 is installed on the housing of an electronic apparatus with the liquid crystal display device 140. The protective plate 145 is positioned adjacent to the surface of the first substrate 141 (the substrate located on the viewing side) in the liquid crystal display device 140. This embodiment assumes the case in which the protective plate 145 made of plastic lies adjacent to the surface of a polarizing plate 146 which is closest to the viewer's side among the components of the first substrate 141. This is advantageous in terms of easiness and low cost in manufacture, however, it is disadvantages in that fine irregularities are easily formed on the surface.

The first substrate 141 and the second substrate 142 of the liquid crystal display device 140 are plate-shaped members made of a material having light transmissivity characteristics such as glass, quartz, plastic, etc. A plurality of transparent electrodes 143 extending in a designated direction are formed on the inner surface (on the side of the liquid crystal 144) of the first substrate 141 arranged on the viewing side. Each transparent electrode 143 is a stripe-shaped electrode made of a transparent conductive material such as ITO (Indium Tin Oxide). The surface of the first substrate 141 provided with the transparent electrodes 143 is coated with a orientation film (not shown). The orientation film is a thin film made of an organic material such as polyamide. A rubbing treatment is performed on the orientation film so as to determine the orientation of the liquid crystal 144 when a voltage is not applied thereto.

2. Light Scattering Film

The polarizing plate 146 for polarizing incident light in a designated direction and a scattering layer 147 sandwiched between the first substrate 141 and the polarizing plate 146 are formed on the outer side (the side provided opposite to the liquid crystal 144) of the first substrate 141. The scattering layer 147 serves to scatter the light passing through the scattering layer 147. The scattering layer 147 includes an adhesive agent 148a for adhering the polarizing plate 146 to the first substrate 141, and fine particles 148b dispersed in the adhesive agent 148a. For example, as the scattering layer 147, the adhesive agent 148a is made of, for example, an acrylic or epoxy material having the fine particles 148b made of silica dispersed therein can be used. The refractivity of the adhesive agent 148a differs from that of the fine particle 148b. The incident light on the scattering layer 147 is refracted at the boundary between the adhesive agent 148a and the fine particle 148b. As a result, it is possible to emit the incident light on the scattering layer 147 scattered appropriately.

In the scattering layer 147 of the fifth embodiment of the present invention, the number of the fine particles 148b dispersed in the adhesive agent 148a and the refractivities of the fine particles 148b and the adhesive agent 148 are determined such that a Haze value H of the scattering layer 147 is any value within the range of 10 to 60%. Here, the Haze value H represents the degree of light scattering when the incident light on a member passes through the member, and is defined by the below equation.

Haze Value $H=(Td/Tt) \times 100 (\%)$

Here, Tt denotes transmittance (%) of whole light, and Td denotes transmittance (%) of scattered light. The transmittance (%) of whole light, Tt, is the ratio of the amount of light passing through a sample, which is a target of measurement of the Haze value H, to the amount of incident light on the sample. On the other hand, the transmittance (%) of scattered light, Td, is the ratio of the amount of light emitted into any direction other than a designated direction (i.e., the amount of scattered light) to the amount of light passing through the sample in case light is irradiated from a designated direction. That is, assuming that transmittance (%) of parallel light, Tp, is the ratio of the amount of light emitted from the sample parallel with the incident light, to the total amount of light emitted from the sample, the above transmittance (%) of scattered light, Td, is represented by the difference between the transmittance (%) of whole light, Tt, and the transmittance (%) of parallel light, Tp (Td=Tt−Tp). Obviously from the above, the larger the Haze value H is, the higher the light scattering degree is (that is, the ratio of the amount of scattered light to the amount of transmitted light is high). In other words, that the smaller the Haze value H is, the lower the light scattering degree is (that is, the ratio of the amount of scattered light to the amount of transmitted light is low). Incidentally, Haze value H is described in detail in JIS (Japanese Industrial Standards) K6714-1977.

3. Reflective Layer (Light Reflective Film)

A reflective layer 149 is formed on the inner surface (on the liquid crystal 144 side) of the second substrate 142. The reflective layer 149 serves to reflect incident light on the liquid crystal device 140 from the viewing side, and is made of a metal having optical reflectivity, such as aluminum or silver.

As shown in FIG. 13, an area of the inner surface of the second substrate 142 coated with the reflective layer 149 has an uneven surface including a plurality of protrusions and concavities. More specifically, in the light reflective film including the base and the reflective layer 149, the plurality of concave portions or convex portions formed on the surface of the base have substantially the same height or depth. The planar shapes of the concave portions or convex portions are circles or polygons, which are separate from each other or partially overlapped with each other, or either thereof. The plurality of concave portions or convex portions are randomly arranged in the plane direction of the reflective layer 149.

Therefore, the surface of the reflective layer 149 is also uneven because of the unevenness of the surface of the second substrate 142 including the protrusions and concavities. That is, the reflective layer 149 has a light scattering structure enabling the layer 149 to scatter light appropriately so as to realize a broad viewing angle. More specifically, the reflective layer 149 is formed on the base including a plurality of concave portions or convex portions, and the plurality of concave portions or convex portions formed on the base have substantially the same height or depth. The planar shapes of the concave portions or convex portions are circles or polygons, which are separate from each other or partially overlapped with each other, or either thereof. The plurality of concave portions or convex portions are randomly arranged in the plane direction of the reflective layer 149.

4. Other Components

Further, the color filter 150, the light-shielding layer 151, the overcoat layer 157 for leveling the irregularities formed by the color filter 150 and the light-shielding layer 151, a plurality of transparent electrodes 154, and an oriented film (not shown) are formed on the surface of the reflective layer 149 coating the second substrate 142.

Each transparent electrode 154 is a stripe-shaped electrode extending in the perpendicular direction (in a horizontal direction of FIG. 13) to the extending direction of the transparent electrodes 143 on the first substrate 141. In the same manner as the transparent electrode 143, each transparent electrode 154 is made of a transparent conductive material such as ITO (Indium Tin Oxide).

In such configuration, the orientation of the liquid crystal 144 is changed by a voltage applied between the transparent electrodes 143 and the transparent electrodes 154. That is, the area where the transparent electrodes 143 and the transparent electrodes 154 cross each other functions as a pixel (sub-pixel). The color filter 150 is a resin layer provided corresponding to each of such pixels, and is colored in one of R, G and B using dyes and pigments.

The light-shielding layer 151 is formed in a lattice-type structure so as to shield a gap portion between pixels. For example, the light-shielding layer 151 is made of a black resin material in which carbon black is dispersed.

5. Operation

The reflection type display is realized by the above-described structure. That is, external light such as sunlight or indoor illuminating light passes through the protective plate 145 to enter the liquid crystal display device 140, and is subsequently reflected by the surface of the reflective layer 149.

Such reflected light passes through the liquid crystal 144 and the first substrate 141 to be properly scattered by the scattering layer 147, then passes through the polarizing plate 146 to be emitted to the viewing side of the liquid crystal display device 140. The light emitted from the liquid crystal display device 140 passes through the protective plate 145 and then is displayed to a viewer.

As described above, in case that the protective plate 145 is made of plastic, it is difficult to form a completely flat surface of the protective plate 145. A plurality of fine concave portions and convex portions are likely formed on the surface of the protective plate 145. In case that such protective plate 145 with the fine concave portions and convex portions is arranged close to the first substrate 141 of the liquid crystal display 140, when the light emitted from the liquid crystal display device 140 passes through the protective plate 145, the light interferes with the protective plate 145. Accordingly, interference fringes corresponding to the concave portions and convex portions are overlapped with a display image, and thereby deterioration of the display quality may occur.

However, according to the studies by the present inventors, as shown in the above-described embodiment, when light passes through the liquid crystal 144 and reaches the protective plate 145, the light is scattered by the scattering layer 147 so that a display of high quality can be achieved.

In the constitution of the liquid crystal display device as shown in FIG. 13, in order to reduce the occurrence of the interference fringe, it is preferable that the Haze value H of the scattering layer 147 is set to be large, i.e., to a high degree of light scattering. However, if the Haze value H is too large (for example, 70% or more), light reaching the protective plate 145 from the liquid crystal display device 140 is excessively scattered, there occurs a new problem that the contrast is decreased, i.e., a display image gets blurred. On the other hand, if the Haze value H of the scattering layer 147 is too small, for example, less than 10%, stains due to the concave portions and convex portions are likely to be seen.

The test results obtained by the present inventors reveal that when the Haze value H of the scattering layer 147 is set to be any value within the range of 10% to 40%, it is possible to prevent the remarkable reduction of contrast of the display image and the deterioration of display quality caused by the concave portions and convex portions formed on the surface of the protective plate 145. As a result, good display quality of the liquid crystal display device is obtained.

Accordingly, preferably, the Haze value H of the scattering layer 147 is set to be in the above range, and more preferably, approximately 20%.

As shown in the fifth embodiment, in case the scattering layer 147 including the adhesive agent 148a and the fine particles 148b dispersed in the adhesive agent 148a is used, the Haze value H can be set differently by controlling the amount (the number) of the fine particles 148b added to the adhesive agent 148a.

That is, if the amount of the fine particles 148b dispersed in the adhesive agent 148a is increased, incident light on the scattering layer 147 is scattered more widely so that the Haze value H of the scattering layer 147 is can be raised. On the other hand, the Haze value H of the scattering layer 147 can be lowered by decreasing the amount of the fine particles 148b added to the adhesive agent 148a.

Furthermore, the liquid crystal display device 140 of the fifth embodiment is advantageous in terms of easily setting the scattering degree of light emitted from the liquid crystal display device 140 within a wide range. That is, in a liquid crystal display device without the scattering layer 147, in order to adjust the scattering degree of light emitted from the liquid crystal display device, it is necessary to adjust the shape of the surface of the reflective layer 149, for example, the heights of convex portions and the depths of concave portions, or the distance between the neighboring convex portions (or concave portions).

However, since it requires technical skill to form the desired shapes of concave portions and convex portions on the second substrate 142, it is not always easy to precisely form the desired shape of the surface of the reflective layer 149. Further, since the adjustable range of the scattering degree of light emitted from the liquid crystal display device 140 only by controlling the shape of the surface of the reflective layer 149 is limited, the scattering degree of light has a limited range.

On the other hand, according to this embodiment, without widely changing the shape of the surface of the reflective layer 149, the scattering degree of light emitted from the liquid crystal display device 140 can be widely and easily adjusted by changing the Haze value H of the scattering layer 147, for example, by properly adjusting the amount of the fine particles 148b dispersed in the adhesive agent 148a. This is also an advantage of this embodiment.

SIXTH EMBODIMENT

In a sixth embodiment of the present invention, a passive matrix transflective type liquid crystal display device is provided comprising a liquid crystal element sandwiched between two substrates, and a light reflective film formed on a substrate provided opposite to the viewing side of the liquid crystal element. The light reflective film includes a base and a reflective layer. A plurality of concave portions or convex portions formed on the base are randomly arranged in the plane direction in 100 to 2,000 RGB dot units or the whole screen area unit.

Hereinafter, with reference to FIG. 14, the passive matrix transflective type liquid crystal display device of the sixth embodiment is described in detail. Herein, the same elements as those of FIG. 13 are denoted by the same reference numerals and their detailed descriptions are omitted.

1. Basic Constitution

As shown in FIG. 14, in the sixth embodiment, a back light unit 153 is disposed on the back of a liquid crystal display device 160 (located opposite to the viewing side). Such back light unit 153 includes a plurality of LEDs 15 (only one LED is shown in FIG. 14) functioning as light sources, a light guide plate 152, a diffusion plate 155, and a reflective plate 156. The light guide plate 152 guides light from the LED 15 incident on its side end surface, toward the whole surface of the second substrate 142 of the liquid crystal display device 160. The diffusion plate 155 uniformly diffuses the light guided by the light guide plate 152 throughout the liquid crystal display device 160. The reflective plate 156 reflects the light which emits from the light guide plate 152 toward the opposite side to the liquid crystal display device 160, toward the liquid crystal display device 160 side.

Here, the LED 15 is not always turned on. In case that the liquid crystal display device 160 is used under no external light, the LED 15 is turned on in response to the instruction of a user or the detection signal by a sensor.

Furthermore, in the liquid crystal display device 160 according to the sixth embodiment, openings 159 are formed in the reflective layer 149 in the areas corresponding to central portions of pixels. Another pair pf polarizing plates are attached to the outer side of the second substrate 142 (the side located opposite to the liquid crystal 144). However, such polarizing plates are omitted in FIG. 14.

2. Operation

The liquid crystal display device 160 having the above-described structure can perform the transmission type display in addition to the reflection type display described in the fifth embodiment. That is, light irradiated from the back light unit 153 to the liquid crystal display device 160 passes through the openings 159 of the reflective layer 149. Such light passes through the liquid crystal 144 and the first substrate 141, is scattered by the scattering layer 147, passes through the polarizing plate 146, and is subsequently emitted to the viewing side. The transmissive type display is performed by allowing the emitted light to pass through the protective plate 145 and to be subsequently emitted at the viewing side of the liquid crystal display device.

Accordingly, in this embodiment, like in the fifth embodiment, even when the protective plate 145 including the fine concave portions and convex portions formed on its surface is located close to the liquid crystal display device 160, the deterioration of display quality due to the above uneven surface structure of the protective plate 145 can be prevented.

SEVENTH EMBODIMENT

In a seventh embodiment of the present invention, a modified liquid crystal display device is provided comprising a liquid crystal element sandwiched between two substrates, and a light reflective film formed on a substrate provided opposite to the viewing side of the liquid crystal element. The light reflective film includes a base and a reflective layer. A plurality of concave portions or convex portions formed on the base is randomly arranged in the plane direction in 100 to 2,000 RGB dot units or a whole screen unit.

(1) First Modification

Although the scattering layer 147 is sandwiched between the first substrate 141 and the polarizing plate 146 in the above-described embodiments, the position of the scattering layer 147 may not be limited thereto. For example, in case that a phase difference plate for compensating an interference fringe is provided between the polarizing plate 146 and the first substrate 141, the scattering layer 147 may be inserted between the phase difference plate and the first substrate 141, or between the phase difference plate and the polarizing plate 146. In short, the scattering layer 147 is only required to be located on the side of the protective plate 145 with reference to the liquid crystal 144.

Furthermore, in the above-described embodiments, the scattering layer 147 in which many fine particles 148b are dispersed in the adhesive agent 148a is used. However, the constitution of the scattering layer 147 is not particularly limited thereto. The scattering layer 147 may have any constitution as long as the layer can scatter incident light. When the scattering layer 147 including the adhesive agent 148a is used, members (for example, the first substrate 141 and the polarizing plate 146 of the above embodiments) by which the scattering layer 147 is sandwiched can be attached to each other by the adhesive agent 148a. Accordingly, as compared with the scattering layer 147 without the adhesive agent 148a, it is possible to reduce the manufacturing cost and to simplify the manufacturing process, which is advantageous.

(2) Second Modification

The fifth embodiment describes the reflective-type liquid crystal display device, and the sixth embodiment describes the transflective type liquid crystal display device. However, the present invention may be applied to a transmissive type liquid crystal display device which performs transmissive type display without the reflective layer 149. That is, the transmission type liquid crystal display device may be formed by removing the reflective layer 149 from the transflective type liquid crystal display device, as shown in FIG. 14.

Further, the present invention may be applied to a transflective type liquid crystal display device using a half mirror, which passes a part of irradiated light and reflects the remaining part of the light, as a substitute for the reflective layer 149 with the openings 159 of the transflective type liquid crystal display device of the fourth embodiment.

(3) Third Modification

The above-described embodiments describe the protective plate 145 made of the plate-shaped plastic member. The surface of the protective plate 145 is likely to form irregularities, so application of the invention can bring remarkable effects. However, the protective plate 145 is not particularly limited to the above material, but may be made of plate-shaped members of various materials.

(4) Fourth Modification.

Although the above-described embodiments describe the case that the present invention is applied to a passive matrix liquid crystal display device, the present invention may be applied to an active matrix liquid crystal display device using a diode switching element represented by a TFD (Thin Film Diode) and a triode switching element represented by a TFT (Thin Film Transistor). Further, although the above-described embodiments describe the case that the color filter 150 and the light-shielding layer 151 are formed on the second substrate 142, the present invention may be applied to a liquid crystal display device comprising such components formed on the first substrate 141, and a liquid crystal display device without the color filter 150 or the light-shielding layer 151. Moreover, the present invention may be applied to the liquid crystal display device 160 with the protective plate 145 located close to the viewing side regardless of the conditions of other components.

(5) Fifth Modification

Although the above fourth embodiment describes the active matrix liquid crystal display device using a TFD, a diode active element, as an active element, the present invention may be applied to an active matrix liquid crystal display device using a TFT, a triode active element, as an active element, as shown in FIG. 13. In this case, as shown in FIG. 13, preferably, the TFT element is formed on a shield area.

EIGHTH EMBODIMENT

In an eighth embodiment, there is provided an electronic apparatus including an optical display device comprising a light reflective film, in which the light reflective film includes a base and a reflective layer, and a plurality of concave portions or convex portions formed on the surface of the base are randomly arranged in the plane direction in 100 to 2,000 RGB dot units or a whole screen unit.

(1) Mobile Computer

Figure 15:
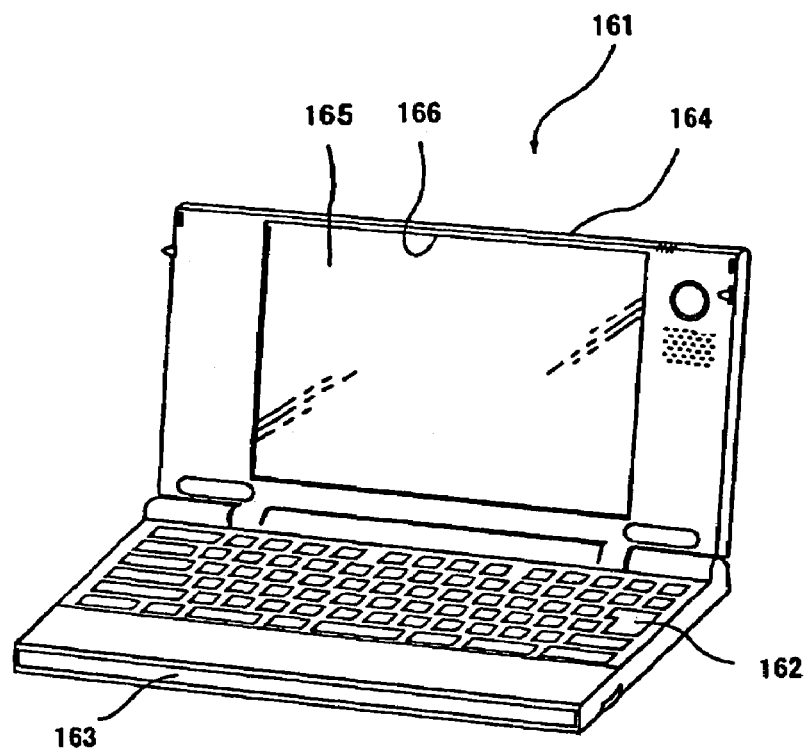
FIG. 15 is a perspective view showing the constitution of a personal computer as one example of electronic apparatus.

Now, a mobile personal computer (i.e., a notebook personal computer) provided with a display unit employing the liquid crystal display device of the present invention is described. FIG. 15 is a perspective view showing the constitution of such a personal computer. As shown in FIG. 15, a personal computer 161 comprises a main body 163 provided with a keyboard 162, and a display unit 164 employing a liquid crystal display device according to the present invention. The display unit 164 is constituted such that the liquid crystal display device 160 according to the present invention is received in a case 166 provided with the plastic protective plate 145 corresponding to a window 165. More specifically, the liquid crystal display device 160 is accommodated in the case 166 such that the substrate surface at the viewing side is located close to the protective plate 145. In the personal computer 161, in order to obtain display with excellent visibility even under insufficient external light, the transflective type liquid crystal display device comprising the back light unit 153 on the rear side, as described in the seventh embodiment, is preferably employed.

(2) Mobile Telephone

Figure 16:
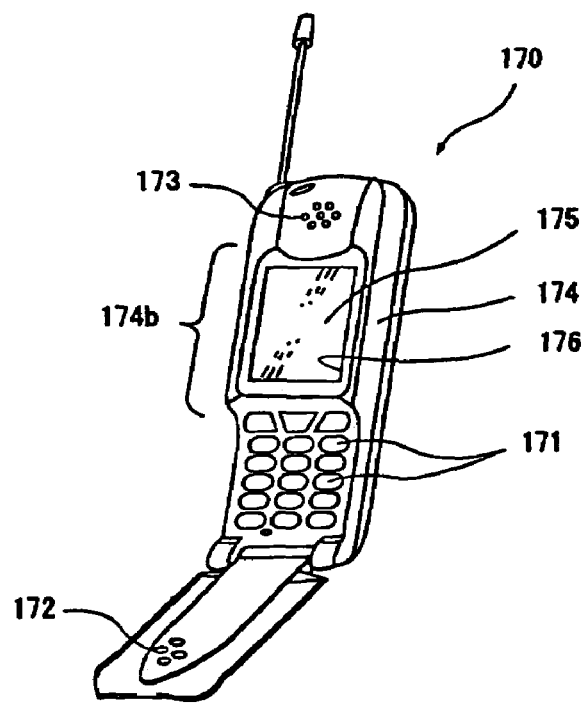
FIG. 16 is a perspective view showing the constitution of a mobile phone as another example of electronic apparatus.
Figure 17:
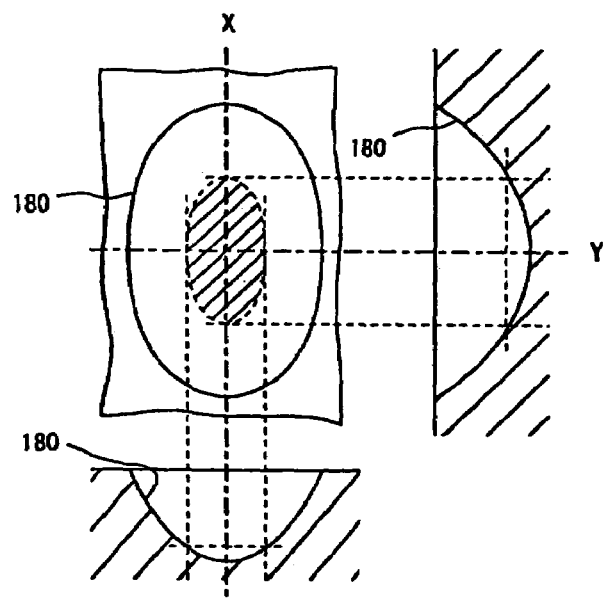
FIG. 17 shows plan and cross-sectional views of a substrate with a light reflective film including substantially cone-shaped concave portions.
Figure 18:
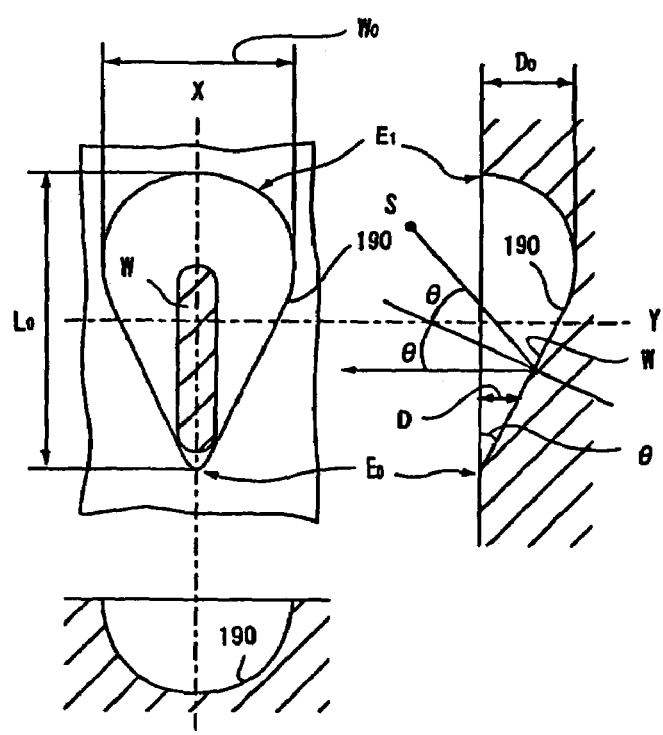
FIG. 18 shows plan and cross-sectional views of a substrate with a light reflective film including asymmetrical, substantially teardrop-shaped concave portions.
Figure 19:
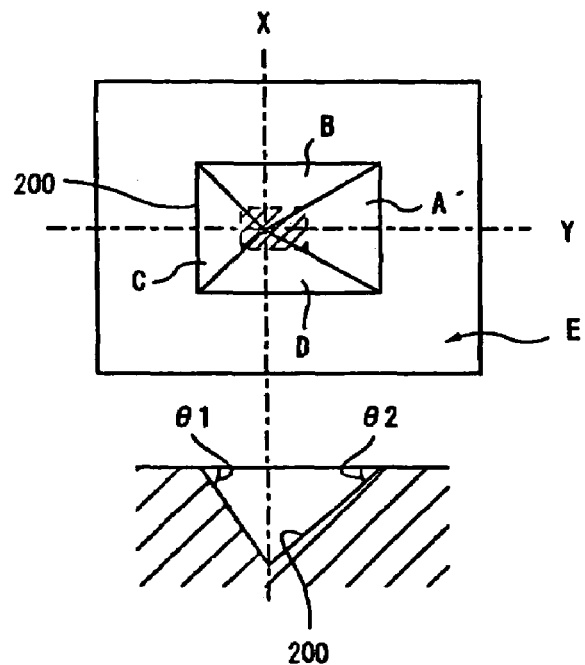
FIG. 19 shows plan and cross-sectional views of a substrate with a light reflective film including pyramid-shaped concave portions.
Figure 20:
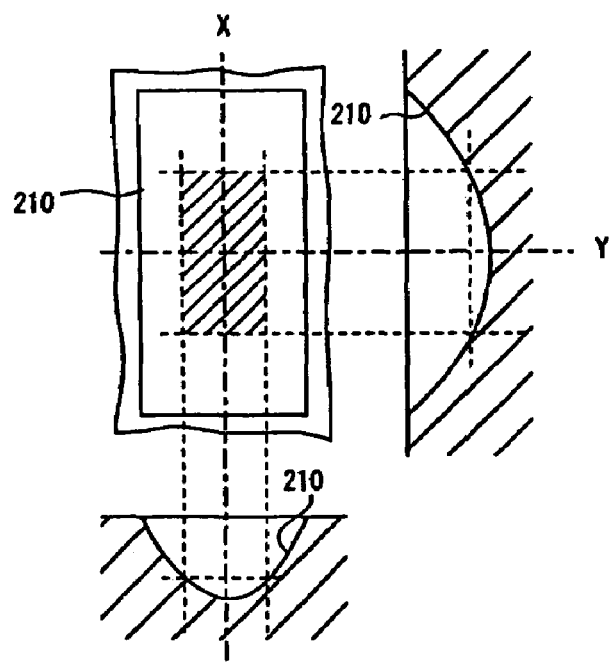
FIG. 20 shows plan and cross-sectional views of a substrate with a light reflective film including concave portions whose horizontal cross-section is an arc shape with a small radius of curvature, and whose vertical section is an arc shape with a large radius of curvature.
Figure 21:
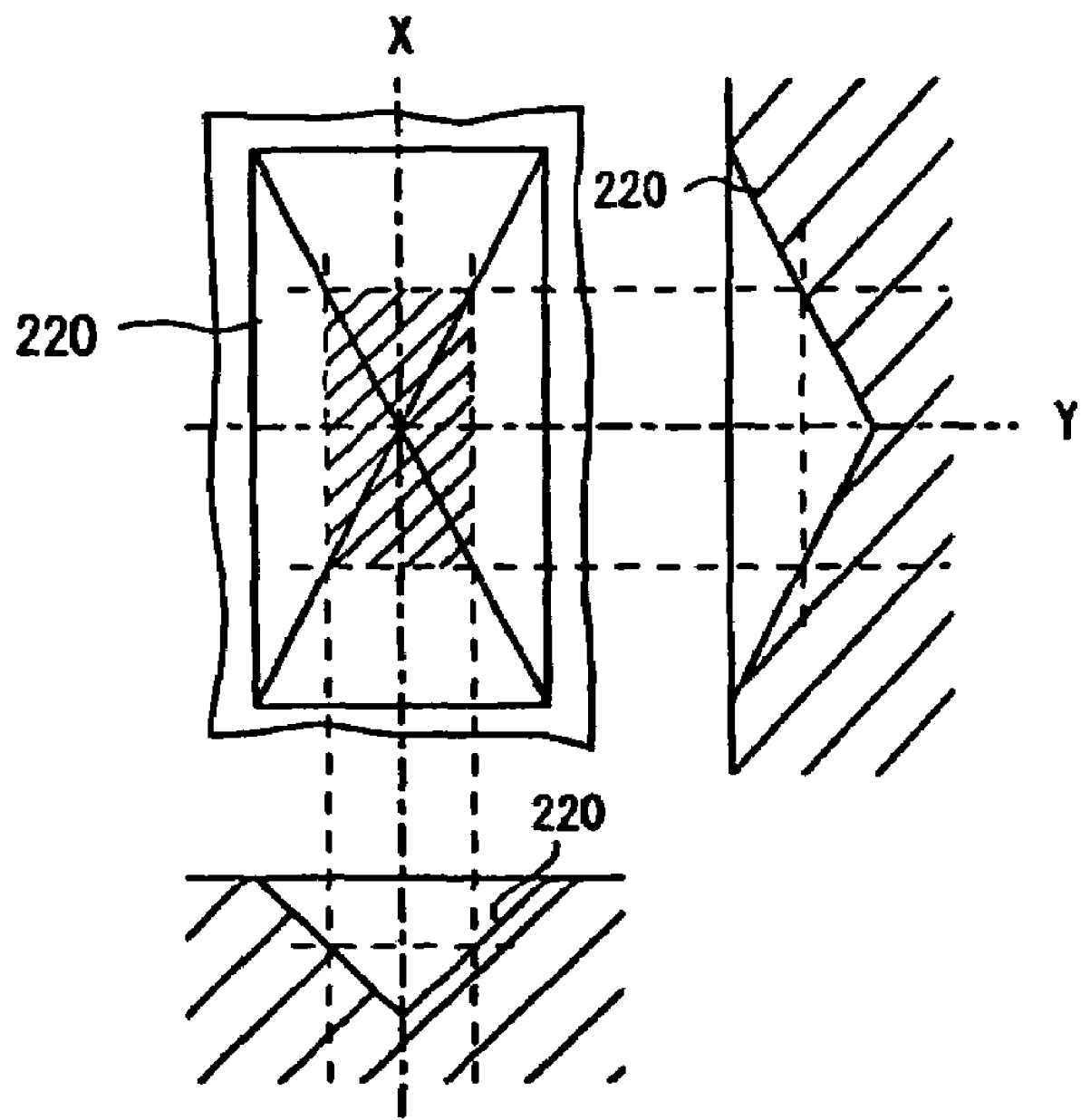
FIG. 21 shows plan and cross-sectional views of a substrate with a light reflective film including concave portions whose horizontal cross-section is a substantially rectangle, and whose vertical section is a pyramid.

Now, a mobile telephone provided with a display device employing a liquid crystal display device of the present invention is described. FIG. 16 is a perspective view of such a mobile telephone. As shown in FIG. 16, a mobile telephone 170 comprises a plurality of operation buttons 171, an earpiece 172, a mouthpiece 173, and a display unit 174 employing a liquid crystal display device (not shown) of the present invention. The mobile telephone 170 is constituted such that the liquid crystal display device of the present invention is received in a case 176 provided with a plastic protective plate 175 corresponding to a window 174b. Like the above personal computer, the liquid crystal display device is accommodated in a case 176 such that the substrate surface at the viewing side is located close to the protective plate 175.

Besides the personal computer of FIG. 15 and the mobile telephone of FIG. 16, the liquid crystal display device of the present invention can be employed in electronic apparatus such as liquid crystal TVs, view finder-type monitor direct view video tape recorders, car navigation apparatuses, pagers, electronic notes, electronic calculators, word processors, work stations, TV phones, POS terminals, apparatus with touch panel, etc.

As apparent from the above description, according to the liquid crystal display of the present invention, even when a protective plate having fine irregularities on its surface is located close to the substrate surface of the display device, it is possible to prevent the deterioration of display quality due to the irregularities. Accordingly, it is possible to slim or miniaturize electronic apparatus without deteriorating the display quality.

EFFECTS OF THE INVENTION

As described above, the mask of the present invention and the light reflective film obtained therefrom respectively comprise a plurality of light transmissive or non-transmissive portions randomly arranged in the plane direction in a predetermined number or more of RGB dot units, thereby suppressing the occurrence of stains of irregular shapes and effectively preventing the occurrence of an interference fringe when the mask and the film are used in liquid crystal display devices, etc. Further, since relatively little information about patterns is needed in making the mask, it is possible to easily and rapidly form the mask used for manufacturing the light reflective film for even a large-sized liquid crystal display device as well as a small liquid crystal display device while reducing the occurrence of the interference fringe.

The liquid crystal display device and electronic apparatus comprising the light reflective film of the present invention suppress the occurrence of stains of irregular shapes, effectively prevent the occurrence of an interference fringe, and are easy to design and manufacture.

Further, in the liquid crystal display device and electronic apparatus comprising the light reflective film of the present invention, even when the protective plate having fine irregularities on its surface is located close to the reflective film, deterioration of display quality due to the irregularities can be prevented.

What is claimed is:

1. A method for manufacturing a light reflective film comprising the steps of:

forming a first base including a plurality of concave portions or convex portions by performing a first exposure process on a first photosensitive resin using a first mask having a striped-shaped pattern of light transmissive or non-transmissive portions in a row direction or in a column direction that is repeated over a plurality of lines, a plurality of the light transmissive and the non-transmissive portions being randomly arranged in a plane direction in 100 to 2,000 dot units;

forming a second base having a plurality of continuous concave portions and convex portions by depositing a second photosensitive resin on the first base and subsequently performing a second exposure process on the second photosensitive resin; and forming a reflective layer on the second base.

2. The method of claim 1, wherein said first exposure process is performed on the first photosensitive resin comprising at least one of acryl-based resin, epoxy-based resin, silicon-based resin, phenol-based resin, oxetane-based resin, silica particles, titanium oxide, zirconium oxide, and aluminum oxide.

3. The method of claim 1, wherein said first exposure process is performed on the first photosensitive resin comprising an inorganic filler.

4. The method of claim 1, wherein said step of forming the first base further comprises applying a first layer comprising the photosensitive resin uniformly on a supporting portion.

5. The method of claim 4, further comprising pre-baking the first layer before said first exposure process is performed.

6. The method of claim 1, wherein said first exposure process is performed at an intensity of from about 50 mJ/cm$^2$ to about 300 mJ/cm$^2$.

7. The method of claim 1, wherein said forming the first base step further comprises a first positive development process.

8. The method of claim 1, further comprising a first post-exposure process that is performed on an entire surface of the first base, said first post-exposure process is performed before the second base is formed.

9. The method of claim 8, wherein said first post-exposure process is performed at an intensity of about 300 mJ/cm$^2$.

10. The method of claim 1, further comprising a first post-baking process that is performed on the first base by heating the first base, said first post-baking process hardens the first base and is performed after said first exposure process.

11. The method of claim 10, wherein said first post-baking process is performed at about 220° C. for about 50 minutes.

12. The method of claim 1, further comprising depositing a coupling agent on the first base.

13. The method of claim 12, wherein said step of depositing a coupling agent further comprises depositing a silane coupling agent.

14. The method of claim 1, wherein said step of forming the second base further comprises applying a second layer comprising the second photosensitive resin on the first base.

15. The method of claim 14, further comprising pre-baking the second layer before said second exposure process.

16. The method of claim 1, wherein said second exposure process is performed at an intensity of from about 50 mJ/cm$^2$ to about 300 mJ/cm$^2$.

17. The method of claim 1, further comprising subjecting the second base to a post-exposure process at an intensity of about 300 mJ/cm$^2$.

18. The method of claim 17, further comprising post-baking the second base after the post-exposure process.

19. The method of claim 1, wherein said reflective layer comprises at least one of aluminum and silver.

20. The method of claim 1, further comprising photo-etching the reflecting layer to remove excess portions of the reflecting layer.

* * * * *